(12) United States Patent
Funatsu

(10) Patent No.: US 7,844,873 B2
(45) Date of Patent: Nov. 30, 2010

(54) FAULT LOCATION ESTIMATION SYSTEM, FAULT LOCATION ESTIMATION METHOD, AND FAULT LOCATION ESTIMATION PROGRAM FOR MULTIPLE FAULTS IN LOGIC CIRCUIT

(75) Inventor: Yukihisa Funatsu, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 526 days.

(21) Appl. No.: 11/867,013

(22) Filed: Oct. 4, 2007

(65) Prior Publication Data

US 2008/0256404 A1 Oct. 16, 2008

(30) Foreign Application Priority Data

Oct. 5, 2006 (JP) .............................. 2006-274031

(51) Int. Cl.
G01R 31/28 (2006.01)
G01R 31/00 (2006.01)
G01R 31/08 (2006.01)
G01R 31/26 (2006.01)
G06F 11/00 (2006.01)
G06F 11/30 (2006.01)

(52) U.S. Cl. .......................... 714/741; 714/25; 714/31; 714/737; 714/742; 714/E11.024; 714/E11.025; 714/E11.026; 714/E11.029; 702/58; 702/59; 702/117; 702/185; 324/500; 324/512; 324/528; 324/765

(58) Field of Classification Search .................. 714/25, 714/31, 737, 741, 742, E11.024, E11.025, 714/E11.026, E11.029; 702/58, 59, 117, 702/185; 324/500, 512, 528, 765

See application file for complete search history.

(56) References Cited

U.S. PATENT DOCUMENTS

| | | | | |
|---|---|---|---|---|
| 6,532,440 B1 * | 3/2003 | Boppana et al. | ................ | 703/14 |
| 6,560,736 B2 * | 5/2003 | Ferguson et al. | ............ | 714/724 |
| 7,283,918 B2 * | 10/2007 | Nozuyama | .................. | 702/117 |
| 7,509,551 B2 * | 3/2009 | Koenemann et al. | ........ | 714/732 |
| 2005/0256651 A1 * | 11/2005 | Taylor | ......................... | 702/19 |

FOREIGN PATENT DOCUMENTS

| | | | |
|---|---|---|---|
| JP | 361032153 A | * | 2/1986 |
| JP | 04-070972 | | 3/1992 |
| JP | 05-341005 | | 12/1993 |
| JP | 11-52023 | | 2/1999 |
| JP | 2000-088925 | | 3/2000 |
| JP | 2001-021618 | | 1/2001 |

OTHER PUBLICATIONS

Khorashadi-Zadeh et al., A Novel Approach to Fault Classification and Fault Location for Medium Voltage Cables Based on Artificial Neural Network, 2006, International Journal of Computational Intelligence, pp. 90-93.*

(Continued)

*Primary Examiner*—John J Tabone, Jr.
(74) *Attorney, Agent, or Firm*—Young & Thompson

(57) ABSTRACT

A fault location estimation system includes single-fault-assumed diagnostic unit nodes; error-observation node basis candidate classification unit; inclusion fault candidate group selection unit; inter-pattern overlapping unit; and multiple-fault simulation checking unit.

21 Claims, 20 Drawing Sheets

OTHER PUBLICATIONS

Appello et al., Understanding yield losses in logic circuits, Jun. 1, 2004, IEEE, vol. 21 Issue:3, pp. 208-215.*

Kiyoshi Takechi et al., On Reducing Candidate Faults in Multiple Stuck-at Fault Diagnosis, 2004, p. 1.

Y. Funatsu et al., Development of Multiple fault Diagnosis Based on Path-Tracing for Logic LSIs, Test Analysis Technology Development Division, NEC Electronics Corporation, 2004, pp. 1-7.

Y. Funatsu et al., Multiple Fault Diagnosis System Based on Path-Tracing for Logic LSIs, Test Analysis Technology Development Division, NEC Electronics Corporation, 2005, pp. 1-7.

Yukihisa Funatsu et al., Development of Multiple Fault Diagnosis Based on Path-Tracing for Logic LSIs, 2005, pp. 1-8.

Hiroshi Takahashi et al., A Method for Diagnosing Multiple Stuck-at Faults in Combinational Circuits using Single and Multiple Fault Simulations, 1999-2, pp. 1-11.

Japanese Patent Office issued a Japanese Office Action dated Sep. 29, 2009, Application No. 2006-274031.

Yukihisa Funatsu, Hiroshi Sumitomo, Kazuki Shigeta, Toshio Ishiyama, "Development to Multiple Fault Diagnosis Based on Path-Tracing for Logic LSIs", Meeting Minutes of LSI Testing Symposium/2004, Japan, LSI Testing Society, Nov. 10, 2004, p. 247-252.

* cited by examiner

TEST PATTERN I

TEST PATTERN II

FAIL PATTERN OVERLAPPING

SPECIFY FAULT CANDIDATES FOR MULTIPLE-FAULT SIMULATION

TEST PATTERN I

TEST PATTERN II

FAIL PATTERN OVERLAPPING

TEST PATTERN I

TEST PATTERN II

FAULT LOCATION ESTIMATION SYSTEM, FAULT LOCATION ESTIMATION METHOD, AND FAULT LOCATION ESTIMATION PROGRAM FOR MULTIPLE FAULTS IN LOGIC CIRCUIT

REFERENCE TO RELATED APPLICATION

The present application is claiming the priority of the earlier Japanese patent application No. 2006-274031 filed on Oct. 5, 2006, the entire disclosure thereof being incorporated herein by reference thereto.

FIELD OF THE INVENTION

The present invention relates to a multiple-fault location estimation system for estimating multiple fault locations speedily and accurately in a logic circuit.

BACKGROUND OF THE INVENTION

As one of conventional fault location estimation systems for multiple faults, reference is made to the fault location estimation system disclosed in Patent Document 1. This fault location estimation system estimates multiple fault locations in a logic circuit by grouping the related internal nodes for each error-observation node where a fault is detected during the test of the logic circuit, performing a single-fault-assumed fault simulation for each internal node, and finding a combination that accounts for entire error outputs.

The fault location estimation system of the related art will be described with reference to FIG. 19. Referring to FIG. 19, the fault location estimation system comprises an input device 1 that has a keyboard or an external interface unit, a data processing device 2 that operates under program control, a storage device 3 such as a hard disk or a memory where information is stored, and an output device 4 such as a display or a printer that is an external interface unit.

The storage device 3 comprises a logic circuit information storage unit 41, a fault candidate storage unit 45, and an error relation node group storage unit 46.

The logic circuit information storage unit 41 stores the following information:
 logic states of signal lines;
 logic states (expected values) of signal lines when the circuit is normal; and
 information on error-observation nodes where an error signal is detected in a test.

The logic circuit information storage unit 41 also stores the information on the configuration of a logic circuit, that is, the following information:
 gate type;
 connection between gates;
 connection between gate and signal line; and
 connection between signal lines.

The nodes in a circuit mean the following parts that constitute the circuit as follows:
 gate;
 gate terminal;
 net
 circuit terminal An error-observation node means one of the following at which the logic state of a circuit can be observed:
 external output terminal of a circuit; and
 scan flip flop (Scan-FF).

The fault candidate storage unit 45 stores the following:
 fault candidates extracted by fault simulation; and
 fault type of fault candidates.

The error relation node group storage unit 46 stores the result of the grouping of the nodes in a logic circuit.

The data processing device 2 comprises initialization means 21, fan-in cone classification means 27, in-node-group fault candidate extraction means 28, and error-observation node checking means 33.

The initialization means 21 references the logic circuit information storage unit 41 to set
 logic circuit type; and
 logic states of input/output terminals for initializing the logic states of the signal lines.

The fan-in cone classification means 27 references the logic circuit information storage unit 41, and performs the fan-in trace beginning at each error-observation node, groups the traced nodes in the circuit according to error-observation nodes, and stores the grouped nodes in the error relation node group storage unit 46.

The in-node-group fault candidate extraction means 28 references the logic circuit information storage unit 41 and the error relation node group storage unit 46 to extract signal lines for each node group, performs single-fault simulation by referencing the logic states of the signal lines stored in the logic circuit information storage unit 41 on the assumption that a fault occurred, and stores signal lines, via which the fault propagates to an error-observation node related to the node group, in the fault candidate storage unit 45 as fault candidates.

The error-observation node checking means 33 references the logic circuit information storage unit 41 and the error relation node group storage unit 46 to calculate a combination of node groups that account for all error-observation nodes where an error was detected by the test result, and outputs the nodes of the node groups, included in the combination, to the output device 4 as fault candidates by referencing the fault candidate storage unit 45.

FIG. 20 is a flowchart showing the operation of the conventional fault location estimation system for multiple faults. Next, the following describes the operation of the conventional system in detail with reference to FIG. 19 and the flowchart in FIG. 20.

First, the initialization means 21 references the logic circuit information storage unit 41 to set
 logic circuit type and
 logic states of input/output nodes for initializing the logic states of the signal lines (step A1).

Next, the fan-in cone classification means 27 references the circuit configuration stored in the logic circuit information storage unit 41, performs the fan-in trace beginning at each error-observation node to classify the nodes into
 node groups affecting only that terminal and
 node groups affecting not only that terminal but also other error-observation nodes, according to error-observation nodes and stores the classified node groups in the error relation node group storage unit 46 (step A8).

The in-node-group fault candidate extraction means 28 references error-observation nodes which are obtained as the test result,
 circuit configuration, and
 logic states of signal lines, all of which are stored in the logic circuit information storage unit 41, and
 node group information stored in the error relation node group storage unit 46 in step A8, performs the fault simulation on the assumption that a single-fault occurred with each node in each node group stuck at 0 or 1 and, by referencing the simulation result, stores the relation between each fault-assumed node and an error-observation node in the fault candidate storage unit 45, and stores the nodes of the same node group in the error relation node group storage unit 46 as the same fault candidate group (step A9).

The error-observation node checking means 33 references the logic configuration stored in the logic circuit information storage unit 41 and the error relation node group storage unit 46 to calculate combinations of node groups that can account for all error-observation nodes, where an error was detected in the test result, and references the fault candidate storage unit 45 to output the fault candidates of each node group to the output device 4 for each combination (step A14).

The conventional system performs the fan-in trace processing to narrow the nodes to those that may propagate an error signal to an error-observation node and, considering its combination, estimates multiple-fault locations.

However, the fan-in trace of a recent LSI circuit with millions of gates results in a huge number of combinations, for example, ten thousand nodes, even if the number of combinations is narrowed to one hundredth. So, the conventional system, if applied to a large-scale circuit, requires a huge amount of calculation and an impractical diagnostic time.

In the conventional system, the results of fault simulation, which assumes single fixed faults, are combined for checking with actual measurements. However, when multiple faults occur at the same time, the propagation path may differ from that of a single fault because the error propagating paths affect each other. In this case, because the multiple-fault combination that accounts for all error outputs cannot be found, the diagnostic accuracy may be reduced.

In addition, the checking of fault simulation, which assumes a single fixed-fault, with actual measurements cannot be applied to a fault mode other than that for a fixed error.

Because the fault location estimation result is output as a combination of nodes, no indication is given as to which candidate node the physical analysis priority should be given. This is especially true when the diagnosis of a large-scale circuit produces many output results.

[Patent Document 1] Japanese Patent Kokai Publication No. JP-A-11-52023

The following analysis is given by the present invention. The entire disclosure of the above mentioned Patent Document is herein incorporated by reference thereto.

A first problem with the conventional system is that it takes long to process a large scale circuit.

The reason is that the method according to the conventional technology performs the fault simulation for all nodes in a node group, generated by the fan-in trace, and checks the simulation result with the test result that is the actual measurements and, therefore, requires a longer diagnosis time as the number of nodes increases. Because the nodes are classified into groups based only on the circuit connections, the fault simulation result and the test result (actual measurements) must be compared considering the combination of all nodes in the fan-in cone. So, when the nodes to be processed are increased, the number of combinations is increased exponentially.

A second problem with the conventional system is that there is a possibility that the accuracy of multiple fault estimation will decrease.

The reason is that the conventional system, which considers only the relation between fault candidate nodes and error-observation nodes with no consideration for the error propagating paths, does not consider the possibility that multiple faults occur at the same time and their propagation paths affect each other.

A third problem with the conventional system is that the system cannot process the fault modes other than the fixed fault mode.

The reason is that the system performs the fan-in trace using the circuit connection information to classify the nodes into groups and checks the single-fault-assumed single-fault simulation results with the actual measurements for estimating fault locations. Therefore, the system cannot process fault modes other than the fixed fault mode.

A fourth problem with the conventional system is that it is difficult to carry out an actual analysis using the output result.

The reason is that, because the fault location estimation result is output as a combination of nodes, no indication is given as to which candidate node the physical analysis priority should be given. This is especially true when the diagnosis of a large-scale circuit produces many output results.

SUMMARY OF THE DISCLOSURE

In view of the foregoing, it is an object of the present invention to provide a fault location estimation system, a fault location estimation method, and a fault location estimation program for estimating multiple faults speedily.

It is another object of the present invention to provide a fault location estimation system, a fault location estimation method, and a fault location estimation program for estimating multiple faults accurately even when the error propagating paths from multiple faults affect each other.

It is still another object of the present invention to provide a fault location estimation system, a fault location estimation method, and a fault location estimation program for estimating multiple faults in a fault mode other than the fixed-fault mode.

The present invention provides the following general configuration.

A first fault location estimation system according to the present invention uses an estimation result of an existing single-fault-assumed estimation system to classify fault candidates into fault candidate groups according to error-observation nodes for each test pattern with consideration for an inclusion relation, calculates combinations of fault candidate groups by overlapping the classified results among all test patterns, performs multiple-fault simulation for the calculated combination result, checks the multiple-fault simulation result with the test result, and outputs the checking result.

More specifically, the fault location estimation system of the present invention comprises:

single-fault-assumed diagnostic means (22 in FIG. 1) that stores fault candidates, types of the faults, and detected error-observation nodes at which an error arrives from the fault candidates using an existing single-fault-assumed fault location estimation system;

error-observation node basis classification means (23 in FIG. 1) that classifies error propagating fault candidates into groups according to the error-observation nodes using the fault candidates and the error-observation nodes;

inclusion fault candidate group selection means (24 in FIG. 1) that acquires a relation between each fault candidate group and a fault output by referencing the logic circuit configuration information and the fault candidate group information, calculates an inclusion relation among the fault candidate groups and, if path information on one fault candidate group includes path information on another fault candidate group, deletes the inclusion fault candidate group;

inter-pattern overlapping means (25 in FIG. 1) that calculates combinations of the fault candidate groups that can reproduce the test result in all test patterns by referencing the fault candidates and the fault candidate classification result and, if there are common fault candidates in the fault candidate groups calculated for multiple patterns, extracts only the common fault candidates and creates a new fault candidate group; and multiple-fault simulation checking means (26 in FIG. 1) that references the logic circuit configuration information, the fault candidates, the fault candidate classification result, and the combinations of fault candidate groups, selects fault candidates from the combinations of the fault candidate groups, one from each fault candidate group, performs multiple-fault simulation, compares the simulation result with the test result, and outputs a combination of the fault candidate groups, which matches relatively well with the test result and has a relatively high fault possibility.

The system classifies fault candidates according to error-observation nodes based on the estimation result of an existing single-fault-assumed fault location estimation system and, with consideration for the inclusion relation among fault candidate groups, calculates combinations of fault candidate groups. In the above description, the figure numbers and reference numerals are added to make it easy to understand the configuration of the present invention but not to limit the present invention. This applies also to the description below.

The present invention with the configuration described above can achieve the above-described object of the present invention by estimating the fault locations in a logic circuit in which multiple faults are active at the same time. A first fault location estimation method of the present invention comprises:

a single-fault-assumed diagnostic step that assumes a single fault and stores fault candidates in the logic circuit, fault types of the fault candidates, and detected error-observation nodes at which an error arrives from the fault candidates by referencing logic circuit configuration information and signal line expected values;

an error-observation node basis classification step that classifies the fault candidates into groups according to the error-observation nodes using the logic circuit configuration information, the fault candidates, and the error-observation node information and stores the groups as fault candidate groups;

an inclusion fault candidate group selection step that acquires a relation between each fault candidate group and a fault output by referencing the logic circuit configuration information and the fault candidate group information, calculates an inclusion relation among the fault candidate groups, and extracts common candidates; and an inter-pattern overlapping step that calculates combinations of the fault candidate groups that can reproduce the test result in all test patterns by referencing the fault candidates and the fault candidate groups, and, if there are common fault candidates in the calculated fault candidate groups, extracts only the common fault candidates and re-registers the common fault candidates as a new fault candidate group.

The first fault location estimation method of the present invention may further comprise:

a multiple-fault simulation checking step that references the logic circuit configuration information, the signal line expected values, the fault candidates, the fault types of the fault candidates, the fault candidate group information, and the combination information on the fault candidate group information, selects fault candidates from the combinations of the fault candidate groups, one from each fault candidate group, performs multiple-fault simulation assuming a fault based on the fault types of the selected fault candidates, compares the simulation result with the test result, and outputs a combination of the fault candidate groups, which matches relatively well with the test result and has a relatively high fault possibility, as well as the fault types of the fault candidates included in the combination of the fault candidate groups. A program of the present invention is also provided by causing a computer to perform the steps described above. The correspondence among the fault location estimation system, the method, and the program is applied also to second to fourth fault location estimation systems of the present invention described below.

A second fault location estimation system of the present invention extracts signal lines, through which a fault propagates to error-observation nodes in a group, by performing single-fault simulation using a result produced by classifying nodes into groups by performing fan-in cone processing beginning at error-observation nodes, re-classifies fault candidates into fault candidate groups according to error-observation nodes in each test pattern with consideration for an inclusion relation, calculates combinations of fault candidate groups by overlapping the re-classified results, performs multiple-fault simulation for a result of the calculated combinations, checks the multiple-fault simulation result with the test result, and outputs the checking result.

More specifically, the fault location estimation system of the present invention comprises:

fan-in cone classification means (27 in FIG. 5) that performs a fan-in trace from error-observation nodes, classifies traced in-circuit nodes into groups according to error-observation nodes, and stores the grouped result;

in-node-group fault candidate extraction means (28 in FIG. 5) that extracts signal lines for each node group, performs single-fault simulation assuming a fault by referencing signal line logic states, and stores signal lines, through which a fault propagates to the error-observation nodes related to the node groups, as fault candidates;

inclusion fault candidate group selection means (24 in FIG. 5) that acquires a relation between each fault candidate group and a fault output by referencing the logic circuit configuration information and fault candidate group information, calculates an inclusion relation among the fault candidate groups and, if path information on one fault candidate group includes path information on another fault candidate group, deletes the inclusion fault candidate group;

inter-pattern overlapping means (25 in FIG. 5) that calculates combinations of the fault candidate groups that can reproduce the test result in all test patterns by referencing the fault candidates and the fault candidate classification result and, if there are common fault candidates in the calculated fault candidate groups in multiple patterns, extracts only the common fault candidates and creates a new fault candidate group;

a multiple-fault simulation checking means (26 in FIG. 5) that references the logic circuit configuration information, the fault candidates, the fault candidate classification result, and the combinations of fault candidate groups, selects fault candidates from the combinations of the fault candidate groups, one from each fault candidate group, performs multiple-fault simulation assuming a fault, compares the simulation result with the test result, and outputs a combination of the fault candidate groups which matches relatively well with the test result and has a relatively high fault possibility.

The system classifies fault candidates according to error-observation nodes and, with consideration for the inclusion relation among fault candidate groups, calculates combinations of fault candidate groups.

The present invention with the configuration described above can achieve the above-described object of the present invention by estimating the fault locations in a logic circuit in which multiple faults are active at the same time.

A third fault location estimation system of the present invention extracts error propagating paths in each test pattern using the estimation result of an existing single-fault-assumed fault location estimation system, classifies fault candidates with a relatively high score into a fault candidate group on an error propagating path basis, calculates combinations of fault candidate groups by overlapping the classified results among all test patterns, performs multiple-fault simulation for the calculated combination result, checks the multiple-fault simulation result with a test result, and outputs the checking result.

More specifically, the fault location estimation system of the present invention comprises:

single-fault-assumed diagnostic means (22 in FIG. 7) that stores fault candidates, fault types of the fault candidates, and detected error-observation nodes, at which an error arrives from the fault candidates, by using an existing single-fault-assumed fault location estimation system;

error propagating path extraction means (29 in FIG. 7) that extracts error propagating paths to an error-observation node through each fault candidate using the logic circuit configuration information, the fault candidates, and error-observation nodes and stores the extracted error propagating paths as path information;

error propagating path classification means (30 in FIG. 7) that selects a candidate with a relatively high fault possibility in each test pattern by referencing the fault candidates and the path information based on the scores of the fault candidates, classifies error propagating paths, related to an error propagating path through which the selected fault candidate passes, into an error propagating path group, and stores fault candidates in the group as a fault candidate group;

inter-pattern overlapping means (25 in FIG. 7) that calculates combinations of the fault candidate groups that can reproduce the test result in all test patterns by referencing the fault candidates and the fault candidate classification result and, if there are common fault candidates in the calculated fault candidate groups calculated in multiple patterns, extracts only the common fault candidates, and re-registers the common fault candidates as a new fault candidate group; and multiple-fault simulation checking means (26 in FIG. 7) that references the logic circuit configuration information, the fault candidates, the fault candidate classification result, and the combinations the fault candidate groups, selects fault candidates from the combinations of the fault candidate groups, one from each fault candidate group, performs multiple-fault simulation, compares the simulation result with the test result, and outputs a combination of the fault candidate groups which matches relatively well with the test result and has a relatively high fault possibility.

The system classifies fault error propagating paths according to error-observation nodes based on the estimation result of an existing single-fault-assumed fault location estimation system and, with consideration for the relation among error propagating paths, calculates combinations of fault candidate groups.

The present invention with the configuration described above can achieve the above-described object of the present invention by estimating the fault locations in a logic circuit in which multiple faults are active at the same time.

A fourth fault location estimation system of the present invention extracts error propagating paths in each test pattern using the estimation result of an existing single-fault-assumed fault location estimation system, classifies error propagating paths into groups in descending order of scores in all test patterns to group high-score fault candidates into fault candidate groups, calculates combinations of fault candidate groups, performs multiple-fault simulation for the calculated combination result, checks the multiple-fault simulation result with the test result, and outputs the checking result.

More specifically, the fault location estimation system of the present invention comprises:

single-fault-assumed diagnostic means (22 in FIG. 9) that stores fault candidates, fault types of the fault candidates, and detected error-observation nodes, at which an error arrives from the fault candidates, by using an existing single-fault-assumed fault location estimation system;

error propagating path extraction means (29 in FIG. 9) that extracts error propagating paths to an error-observation node through each fault candidate using the logic circuit configuration information, the fault candidates, and the error-observation nodes and stores the extracted error propagating paths as path information;

base fault candidate extraction means (31 in FIG. 9) that uses the logic circuit configuration information, the fault candidates, the error-observation nodes, and the scores of the fault candidates to search for an error propagating path, which has the highest fault possibility, from all test patterns and stores the fault candidates, included in the path, as a base candidate group;

error propagating path classification 2 means (32 in FIG. 9) that selects candidates, which has a high fault possibility, by referencing the fault candidates and path information and by referring to the base candidate group, classifies the error propagating paths, related to an error propagating path through which the selected fault candidates pass, into an error propagating path group related to the fault candidates, and stores fault candidates, included in the group, as a fault candidate group; and multiple-fault simulation checking means (26 in FIG. 9) that references the logic circuit configuration information, the fault candidates, the fault candidate classification result, and combinations of the fault candidate groups, selects fault candidates from the combinations of the fault candidate groups, one from each fault candidate group, performs multiple-fault simulation, compares the simulation result with the test result, and outputs a combination of the fault candidate groups which matches relatively well with the test result and has a relatively high fault possibility.

The system classifies the related paths in descending order of scores based on the estimation result of an existing single-fault-assumed fault location estimation system and calculates the combinations of fault candidate groups.

The present invention with the configuration described above can achieve the above-described object of the present invention by estimating the fault locations in a logic circuit in which multiple faults are active at the same time.

The present invention greatly reduces the fault diagnosis time. The reason is that the system according to the present invention, which references the fault candidates and the error-observation nodes acquired by existing single-fault-assumed diagnostic means, reduces the number of fault simulations for extracting fault candidate or, in some cases, eliminates the need for the fault simulations. In addition, to reduce the number of combinations, the system classifies the fault candidates, each of which causes a fault in the same observation node, into one fault candidate group in each test pattern and calculates the combinations considering the inclusion relation among fault candidate groups.

The present invention gives a more accurate combination of fault candidates. The reason is that the system according to the present invention selects a fault candidate from each fault candidate group and classifies error propagating paths into a group or makes a check via multiple-fault simulation considering a case in which multiple faults occur at the same time. This gives an estimation result with consideration for a case in which the error propagating paths affect each other.

In addition, the present invention can estimate faults in a fault mode other than the fixed-fault mode. The reason is that the system according to the present invention uses a result of the single-fault-assumed diagnostic means to estimate the behavior of the fault candidates in each test pattern. Therefore, the system can estimate faults in a mode other than the fixed-fault mode considered by the single-fault-assumed means, for example, Open fault and Bridge fault.

In addition, the present invention allows fault candidates suitable for physical analysis to be selected. The reason is that the system according to the present invention gives one fault candidate group for each actual fault location as a diagnosis result. Therefore, by selecting a fault candidate group composed of a fewer fault candidates or by referencing the layout information on the candidate nodes, a fault candidate group including easy-to-observe fault candidates can be selected for physical analysis.

The present invention can output a single-fault estimation result and a multiple-fault estimation result at the same time. The reason is that the multiple-fault location estimation system according to the present invention includes single-fault-assumed diagnostic means and uses the diagnostic result of the means.

The present invention allows fault candidates suitable for actual analysis to be selected. The reason is that the system according to the present invention makes a fault candidate group correspond to each actual fault candidate. Therefore, a fault candidate group composed of a fewer candidates or a fault candidate group including easy-to-observe locations as candidates can be selected.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

Figure 1:
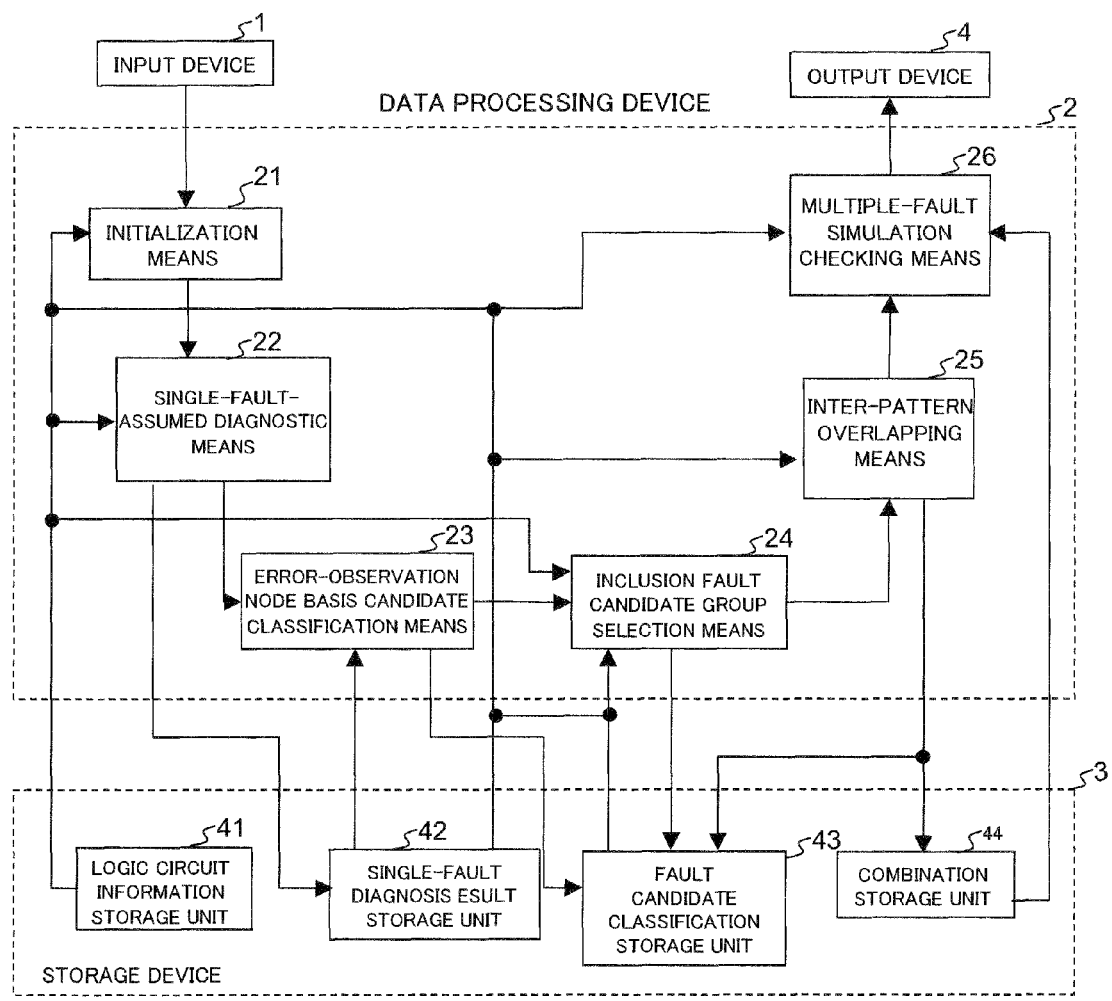
FIG. 1 is a block diagram showing the configuration of a first example of the present invention.

Next, preferred modes of the present invention will be described in detail with reference to the drawings. FIG. 1 is a diagram showing the configuration of a first example of the present invention. Referring to FIG. 1, the first example of the present invention comprises an input device 1 that has a keyboard or an external interface unit, a data processing device 2 that operates under program control, a storage device 3 such as a hard disk or a memory where information is stored, and an output device 4 such as a display or a printer that is an external interface unit.

The storage device 3 comprises a logic circuit information storage unit 41, a single-fault diagnosis result storage unit 42, a fault candidate classification storage unit 43, and a combination storage unit 44.

The logic circuit information storage unit 41 stores the following information:

logic states of signal lines being processed;

logic states (expected values) of signal lines when the circuit is normal; and information on error-observation nodes in which an error is detected as the result of a test.

The logic circuit information storage unit 41 also stores the information on the configuration of a logic circuit on a path, that is, the following information:
- gate type;
- connection between gates;
- connection between gate and signal line; and
- connection between signal lines.

The single-fault diagnosis result storage unit 42 stores the following:
- fault candidates obtained by narrowing fault locations assuming that a single fault occurs;
- fault types of fault candidates; and
- information on error-observation nodes to which an error propagates from a fault candidate.

The fault candidate classification storage unit 43 stores classification information on fault candidate groups produced as the result of classifying fault candidates.

The combination storage unit 44 stores combinations of fault candidates by which the test result can be reproduced.

The data processing device 2 comprises initialization means 21, single-fault-assumed diagnostic means 22, error-observation node basis candidate classification means 23, inclusion fault candidate group selection means 24, inter-pattern overlapping means 25, and multiple-fault simulation checking means 26.

The initialization means 21 references the logic circuit information storage unit 41 to:
- set the logic circuit type and the logic states of input/output terminals, and
- initialize the logic states of signal lines.

The single-fault-assumed diagnostic means 22 references the logic circuit information storage unit 41, narrows the single-fault-assumed fault locations in the circuit, and stores in the single-fault diagnosis result storage unit 42 the following result:
- fault candidates;
- fault types; and
- detected error-observation nodes at which an error arrives from a fault candidate.

The error-observation node basis candidate classification means 23 uses
- fault candidates, and error-observation nodes stored in the single-fault diagnosis result storage unit 42, classifies the error propagating fault candidates into groups according to error-observation nodes, and stores the classified result in the fault candidate classification storage unit 43 as fault candidate groups.

The inclusion fault candidate group selection means 24 references
- logic circuit configuration information stored in the logic circuit information storage unit 41, and
- fault candidate group information stored in fault candidate classification storage unit 43, acquires the relation between fault candidates group and fault outputs, calculates the inclusion relation among the fault candidate groups, and if the path information on one fault candidate group includes the path information on another fault candidate group, deletes the inclusion fault candidate group from the fault candidate classification storage unit 43.

The inter-pattern overlapping means 25 references
- single-fault diagnosis result storage unit 42, and
- fault candidate classification storage unit 43, calculates combinations of fault candidate groups, which can reproduce the test result stored in the logic circuit information storage unit 41, for all test patterns, and stores the calculated combinations in the combination storage unit 44. At this time, if there are common fault candidates in the fault candidate groups calculated for multiple patterns, the inter-pattern overlapping means 25 extracts only those common fault candidates to create a new fault candidate group and re-registers it in the fault candidate classification storage unit 43 as a new fault candidate group.

The multiple-fault simulation checking means 26 references
- logic circuit information storage unit 41,
- single-fault diagnosis result storage unit 42,
- fault candidate classification storage unit 43, and
- combination storage unit 44, selects fault candidates from each fault candidate group, one at a time, for a combination of fault candidate groups, performs multiple-fault simulation on the assumption that a fault occurs, based on the fault type stored in the single-fault diagnosis result storage unit 42, compares the simulation result and test result, and outputs a combination of fault candidate groups, which closely matches the test result and is likely related to the fault, to the output device 4.

Figure 3:
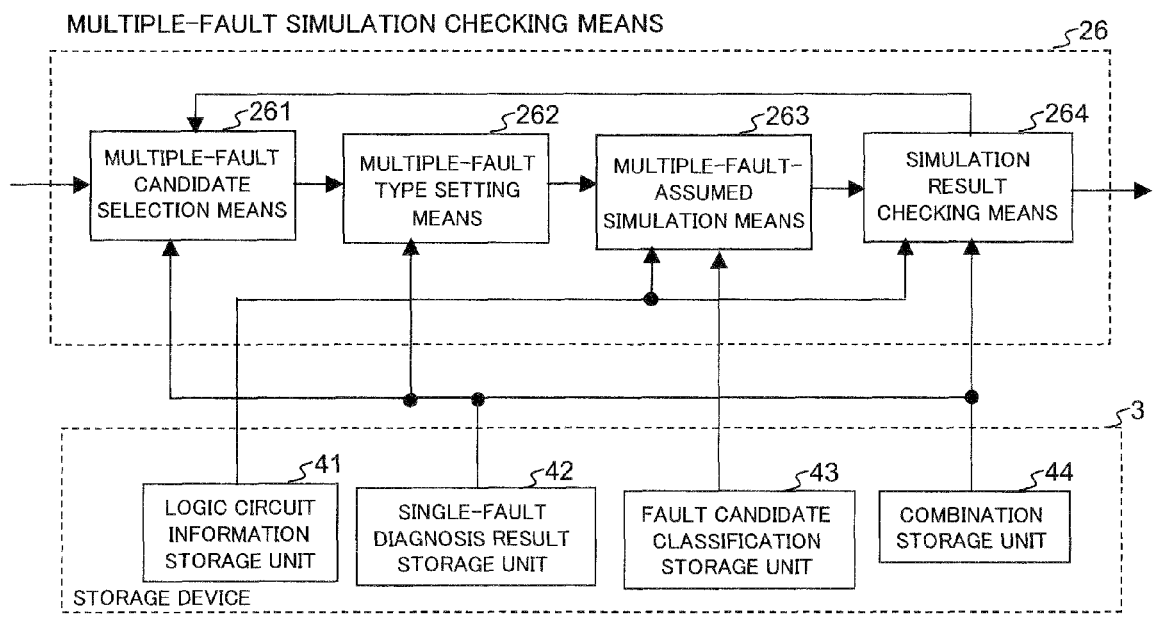
FIG. 3 is a block diagram showing the configuration of multiple-fault simulation checking means in the first, second and third examples of the present invention.

FIG. 3 is a diagram showing an example of the detailed configuration of the multiple-fault simulation checking means 26 shown in FIG. 1. Referring to FIG. 3, the multiple-fault simulation checking means 26 comprises multiple-fault candidate selection means 261, multiple-fault type setting means 262, multiple-fault-assumed simulation means 263, and simulation result checking means 264.

The multiple-fault candidate selection means 261 references
- single-fault diagnosis result storage unit 42
- fault candidate classification storage unit 43, and
- combination storage unit 44, and selects fault candidates from fault candidate groups, one from each group, to create a combination.

The multiple-fault type setting means 262 references the single-fault diagnosis result storage unit 42, acquires the fault types of the fault candidates selected by the multiple-fault candidate selection means 261, and sets the fault state.

The multiple-fault-assumed simulation means 263 references
- selected fault candidates,
- fault types that are set by the multiple-fault type setting means 262, and
- logic circuit information storage unit 41, performs multiple-fault simulation for setting multiple fault candidates at the same time, and passes the result to the simulation result checking means 264.

The simulation result checking means 264 checks
- the multiple-fault simulation result and
- the test result stored in the logic circuit information storage unit 41, and calculates the matching rate between both results. At this time, a high matching-rate combination of fault candidates is determined to be multiple-fault candidates with a high fault possibility. It is also possible to provide a threshold and output a match/mismatch determination result. The matching rate may also be output as the fault possibility degree.

Next, the simulation result checking means 264 references
- single-fault diagnosis result storage unit 42,
- fault candidate classification storage unit 43, and
- combination storage unit 44, and if there is an unselected combination of fault candidates, returns control back to the processing of the multiple-fault candidate selection means 261.

Figure 2:
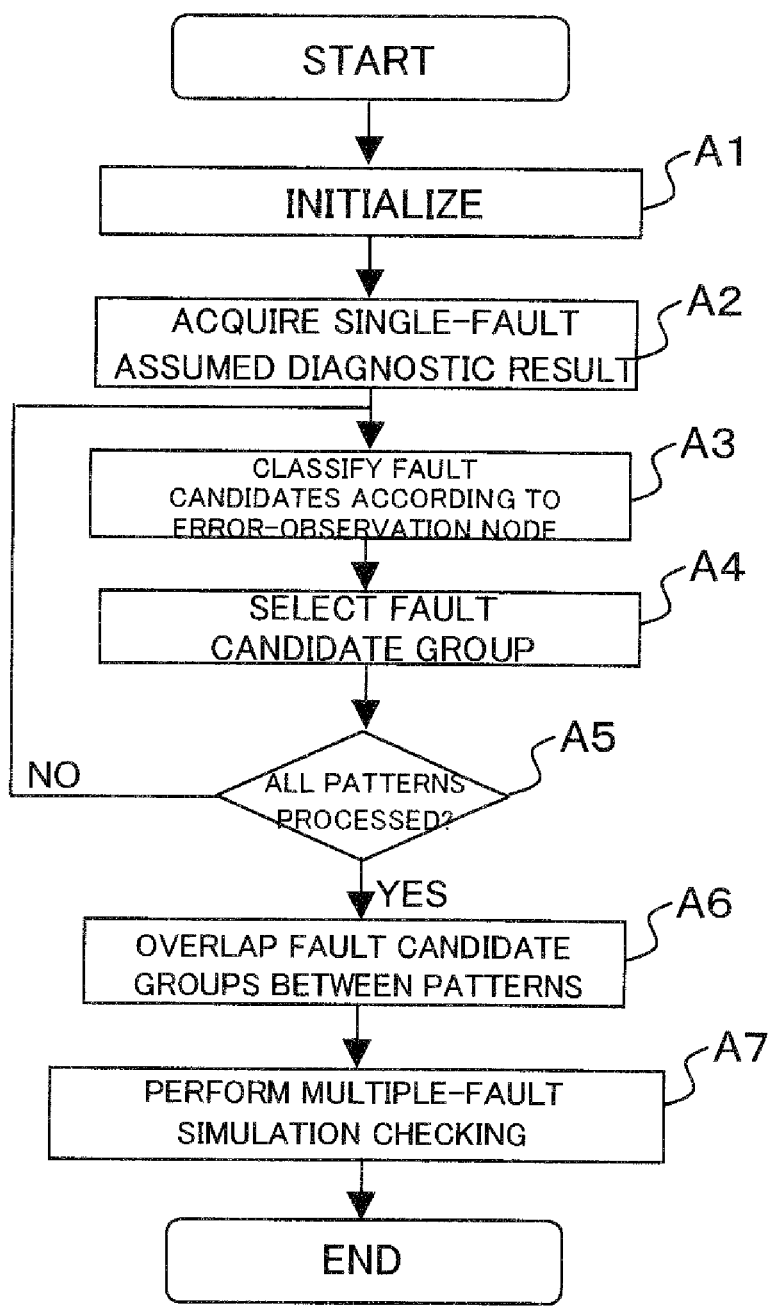
FIG. 2 is a flowchart showing the operation of the first example of the present invention.

FIG. 2 is a flowchart showing the operation of the first example of the present invention. Referring to FIG. 1, FIG. 3 and the flowchart in FIG. 2, the following describes in detail the operation of the first example of the present invention.

First, the initialization means 21 references the logic circuit information storage unit 41, sets the logic circuit types and the input/output terminal logic states, and initializes the logic states of the signal lines (step A1).

The single-fault-assumed diagnostic means 22 references the logic circuit information storage unit 41, uses an existing single-fault-assumed fault location estimation system, and stores the narrowed estimation result, which indicates the fault locations in the circuit, that is, fault candidates, fault types, and detected error-observation nodes at which an error arrives from a fault candidate, in the single-fault diagnosis result storage unit 42 (step A2).

The single-fault-assumed fault location estimation system is one of the following:

(1) fault dictionary method in which a fault dictionary is created and compared with the test result;

(2) fault simulation method in which, with the fault range limited by the cone intersection method, the fault simulation is performed for the signal lines in a limited location and, after that, the simulation result is compared with the test result; and (3) path tracing method in which an error propagating path is estimated and traced by comparing measured values with expected values beginning at an error-observation node Next, the error-observation node basis candidate classification means 23 uses fault candidates, and error-observation nodes stored in the single-fault diagnosis result storage unit 42, classifies the error propagating fault candidates into groups according to error-observation nodes, and stores the classified result in the fault candidate classification storage unit 43 as fault candidate groups (step A3).

The inclusion fault candidate group selection means 24 references logic circuit configuration information stored in the logic circuit information storage unit 41, and fault candidate group information stored in fault candidate classification storage unit 43, acquires the relation between fault candidates group and fault outputs, calculates the inclusion relation among the fault candidate groups, and if the path information on one fault candidate group includes the path information on another fault candidate group, deletes the inclusion fault candidate group from the fault candidate classification storage unit 43 (step A4).

The inter-pattern overlapping means 25 references single-fault diagnosis result storage unit 42, and fault candidate classification storage unit 43, calculates combinations of fault candidate groups, which can reproduce the test result stored in the logic circuit information storage unit 41, for all test patterns, and stores the calculated combinations in the combination storage unit 44.

For example, assume that, for all test patterns, error-observation nodes I, II, III, and IV are detected, fault candidate group A accounts for error output fault terminals I and II fault candidate group B accounts for error output fault terminals II and III, and fault candidate group C accounts for error output fault terminals III and IV.

In this case, the combination of fault candidate groups that covers the test result is the fault candidate group (A, C).

At this time, if there are overlapping fault candidate groups between different patterns, the inter-pattern overlapping means 25 extracts only those common fault candidates to create a new fault candidate group and re-registers it in the fault candidate classification storage unit 43 as a new fault candidate group (step A6).

The multiple-fault simulation checking means 26 references logic circuit information storage unit 41, single-fault diagnosis result storage unit 42, fault candidate classification storage unit 43, and combination storage unit 44, selects fault candidates from fault candidate groups, one from each fault candidate group, for the combinations of fault candidate groups, performs multiple-fault simulation on the assumption that a fault occurs, based on the fault type stored in the single-fault diagnosis result storage unit 42, compares the simulation result and test result, and outputs a combination of fault candidate groups, which closely matches the test result and has a high fault possibility, to the output device 4 (step A7).

Figure 4:
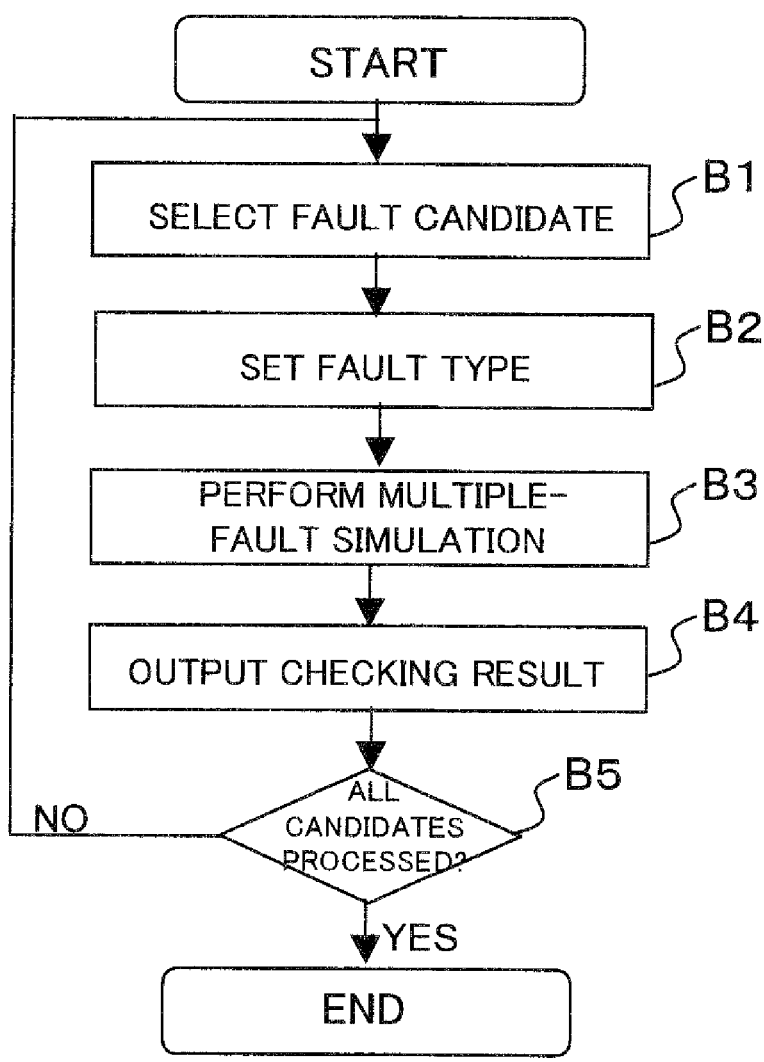
FIG. 4 is a flowchart showing the operation of the multiple-fault simulation checking means in the first example of the present invention.

FIG. 4 is a detailed flowchart showing the multiple-fault simulation checking operation (step A7) shown in the flowchart in FIG. 2. The following describes in detail the multiple-fault simulation checking operation with reference to the flowchart in FIG. 3 and FIG. 4.

First, in step B1, the multiple-fault candidate selection means 261 references single-fault diagnosis result storage unit 42 fault candidate classification storage unit 43, and combination storage unit 44, and selects fault candidates from fault candidate groups, one from each group, to create a combination.

In step B2, the multiple-fault type setting means 262 references the fault types of the fault candidates of each test pattern stored in the single-fault diagnosis result storage unit 42 and sets the fault type of the fault candidates, selected in step B1, for each test pattern.

In step B3, the multiple-fault-assumed simulation means 263 references fault candidates selected in step B1, fault types that are set in step B2, and logic circuit information storage unit 41, performs multiple-fault simulation for setting multiple fault candidates at the same time, and passes the result to the simulation result checking means 264.

In step B4, the simulation result checking means 264 checks the multiple-fault simulation result and the test result stored in the logic circuit information storage unit 41, and calculates the matching rate between both results. At this time, a high matching-rate combination of fault candidates is determined to be a multiple-fault candidate with a high fault possibility. It is also possible to provide a threshold and output a match/mismatch determination result. Alternatively, the matching rate may also be output as a fault possibility degree.

In step B5, the simulation result checking means 264 returns control back to step B1 if there is a combination of unselected fault candidates and repeats the processing from step B1 to step B4 until all combinations of fault candidates are processed.

Figure 5:
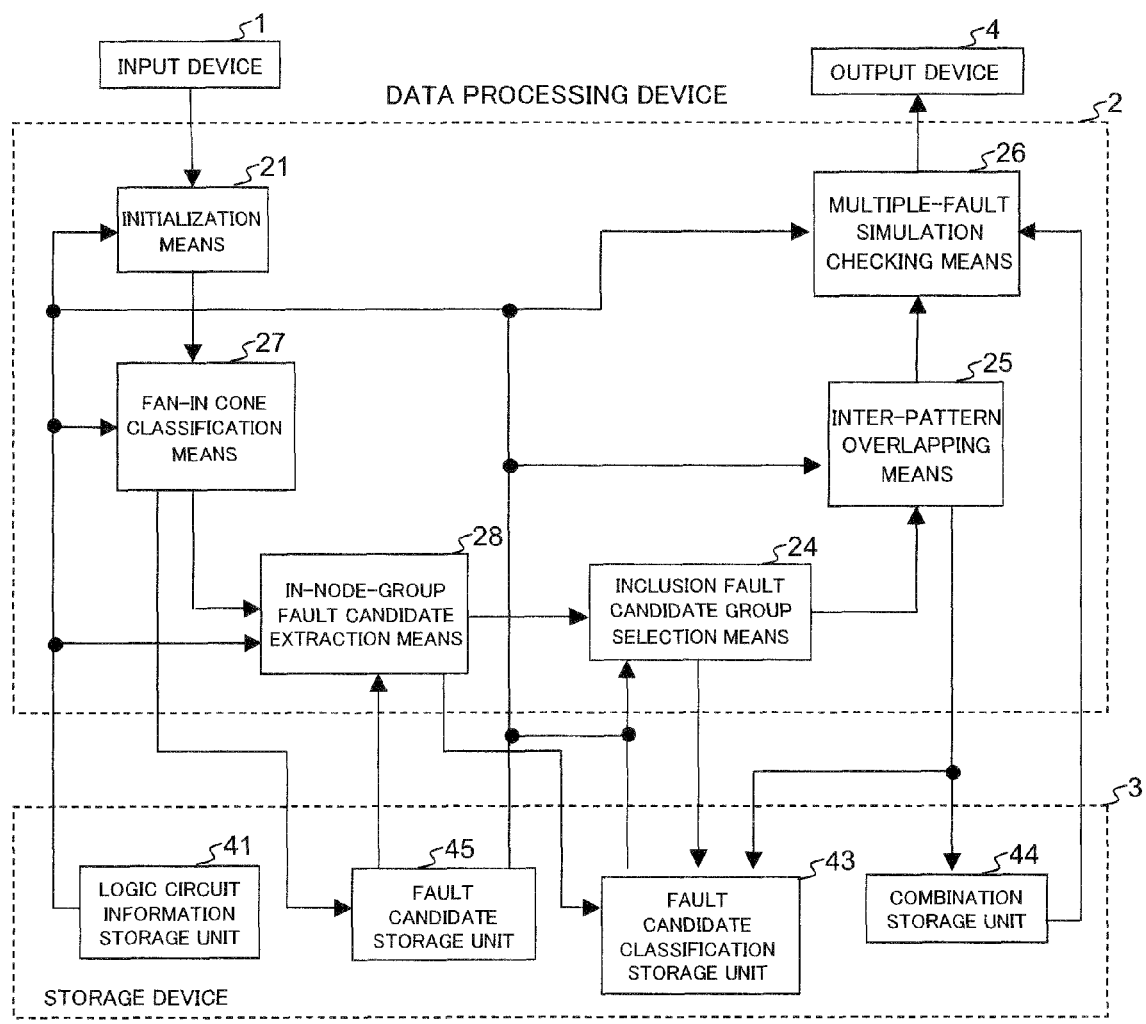
FIG. 5 is a block diagram showing the configuration of a second example of the present invention.

Next, the following describes a second example of the present invention in detail with reference to FIG. 5.

FIG. 5 is a block diagram shown the configuration of the second example of the present invention. Referring to FIG. 5, the second example of the present invention is configured in such a way that, unlike the configuration shown in FIG. 1, a data processing device 2 comprises a fan-in cone classification means 27 and an in-node-group fault candidate extraction means 28 but does not comprise the single-fault-assumed diagnostic means 22 and the error-observation node basis candidate classification means 23. A storage device 3 comprises a fault candidate storage unit 45 but does not comprise the single-fault diagnosis result storage unit 42 shown in FIG. 1.

Figure 19:
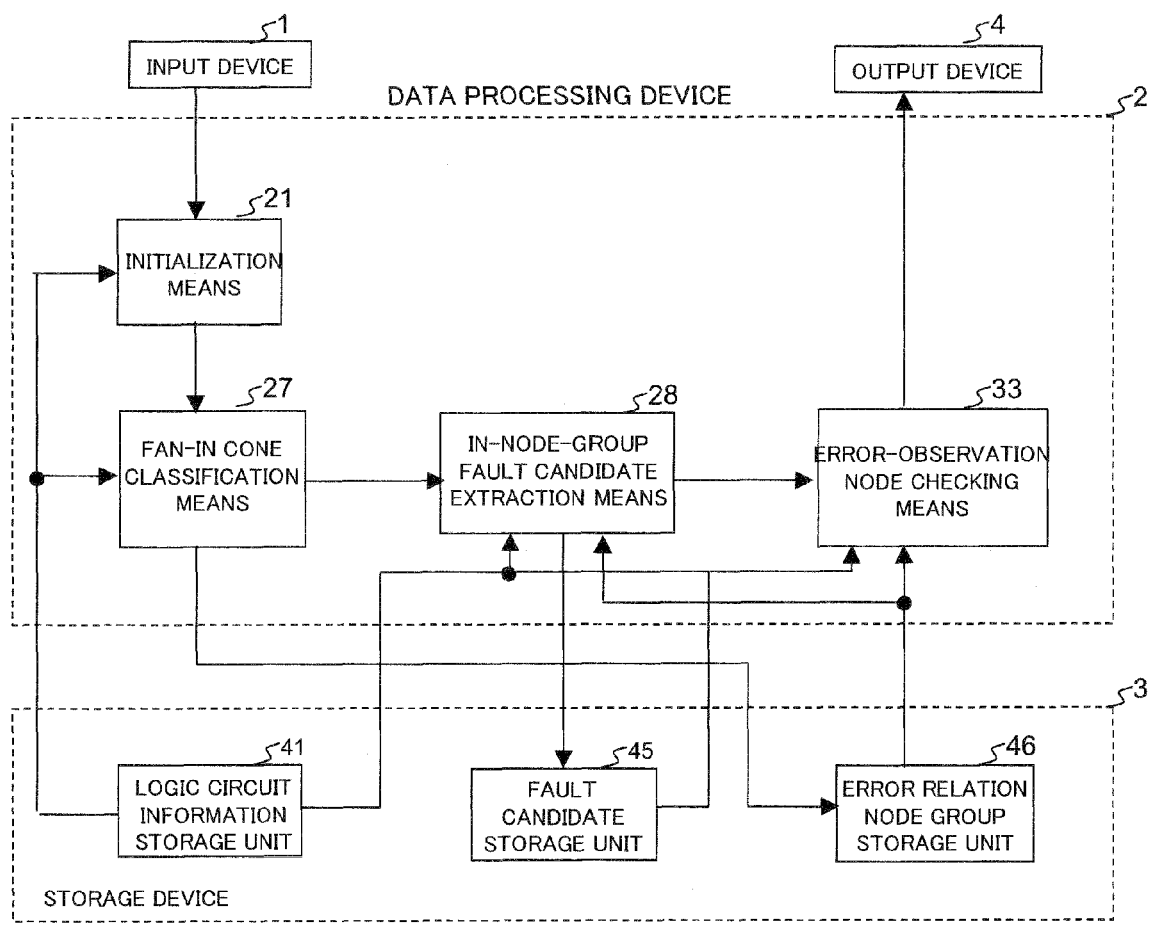
FIG. 19 is a block diagram showing the configuration of a related art.

The fan-in cone classification means 27 and the in-node-group fault candidate extraction means 28 perform the operation similar to that of the fan-in cone classification means 27, and the in-node-group fault candidate extraction means 28 shown in FIG. 19.

The fan-in cone classification means 27 in FIG. 5 performs a fan-in trace from an error-observation node by referencing a logic circuit information storage unit 41, groups the traced in-circuit nodes according to error-observation nodes, and stores the grouped result in the fault candidate storage unit 45.

The in-node-group fault candidate extraction means 28 extracts signals lines for each node group by referencing the logic circuit information storage unit 41 and the fault candidate storage unit 45, assumes a fault and performs a single-fault simulation by referencing the signal line logic states stored in the logic circuit information storage unit 41, and stores the signal lines, through which a fault propagates to the error-observation nodes related to the node group, in a fault candidate classification storage unit 43 as fault candidates.

Figure 6:
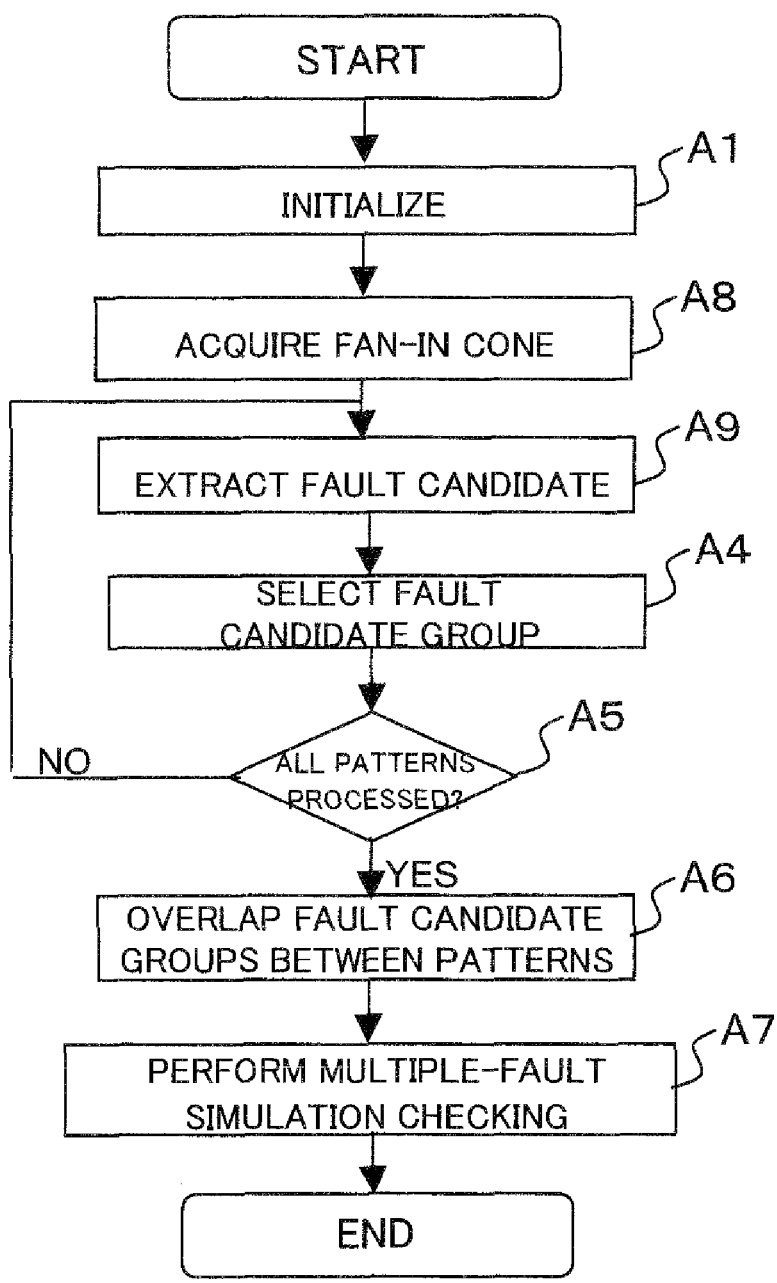
FIG. 6 is a flowchart showing the operation of the second example of the present invention.

FIG. 6 is a flowchart showing the operation of the second example of the present invention. The following describes the operation of the second example of the present invention with reference to FIG. 5 and FIG. 6. Referring to FIG. 6, the operation of the second example of the present invention is that the fan-in cone acquisition operation in step A8 is performed instead of the single-fault-assumed diagnostic result acquisition operation in step A2 shown in FIG. 2 and that the fault candidate extraction operation in step A9 is performed instead of the error-observation node basis classification operation in step A3. The other operation is the same as that of the first example.

Figure 20:
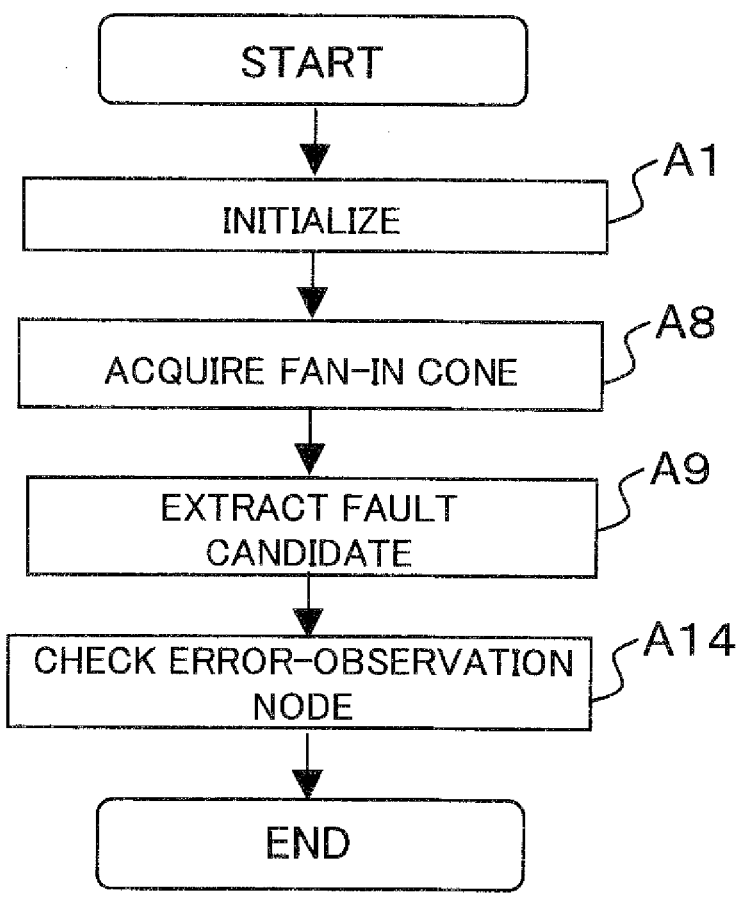
FIG. 20 is a flowchart showing the operation of the related art.

The fan-in cone acquisition operation in step A8 and the fault candidate extraction operation in step A9 are the same as those of the fan-in cone acquisition operation in step A8 and the fault candidate extraction operation in step A9 in FIG. 20 and, therefore, the detailed description of the operation flow is omitted here.

Figure 7:
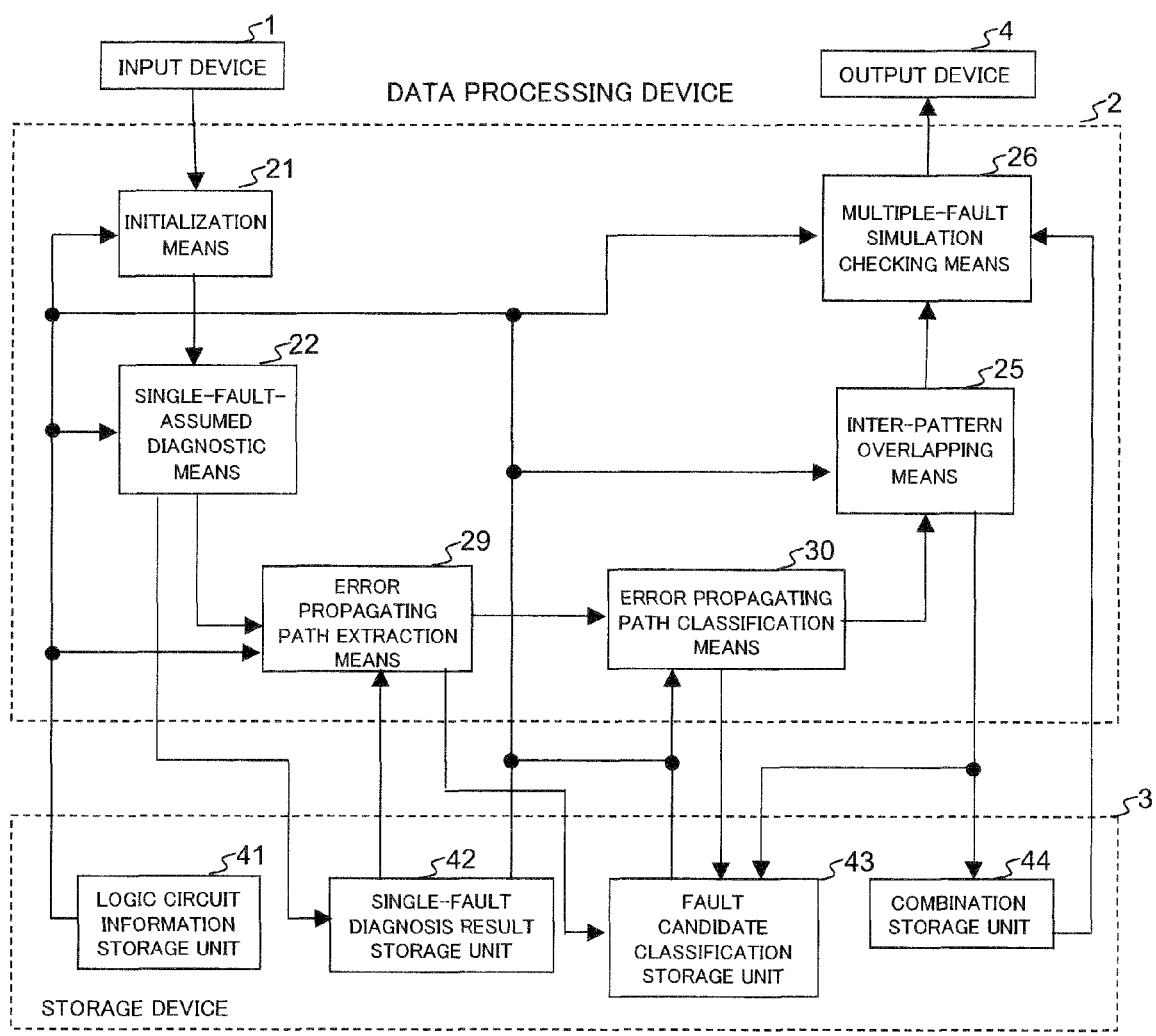
FIG. 7 is a block diagram showing the configuration of a third example of the present invention.

FIG. 7 is a block diagram showing the configuration of a third example of the present invention. Referring to FIG. 7, the third example of the present invention is configured in such a way that, unlike the configuration shown in FIG. 1, a data processing device 2 comprises error propagating path extraction means 29 and error propagating path classification means 30. The data processing device 2 does not comprise the error-observation node basis candidate classification means 23 and the inclusion fault candidate group selection means 24 shown in FIG. 1.

The error propagating path extraction means 29 uses
logical configuration stored in a logic circuit information storage unit 41,
fault candidates stored in a single-fault diagnosis result storage unit 42, and
error-observation nodes to extract an error propagating path, through which a fault propagates to an error-observation node via the fault candidates, and stores the extracted result in the single-fault diagnosis result storage unit 42 as path information.

The error propagating path classification means 30 references
fault candidates and error propagating path information stored in the single-fault diagnosis result storage unit 42, selects a candidate with a high fault possibility by referencing the scores of fault candidates, classifies error propagating paths, related to the error propagating path through which the selected fault candidate passes, into an error propagating path group related to the error candidate, and stores the fault candidates in the group in a fault candidate classification storage unit 43 as a fault candidate group.

Figure 8:
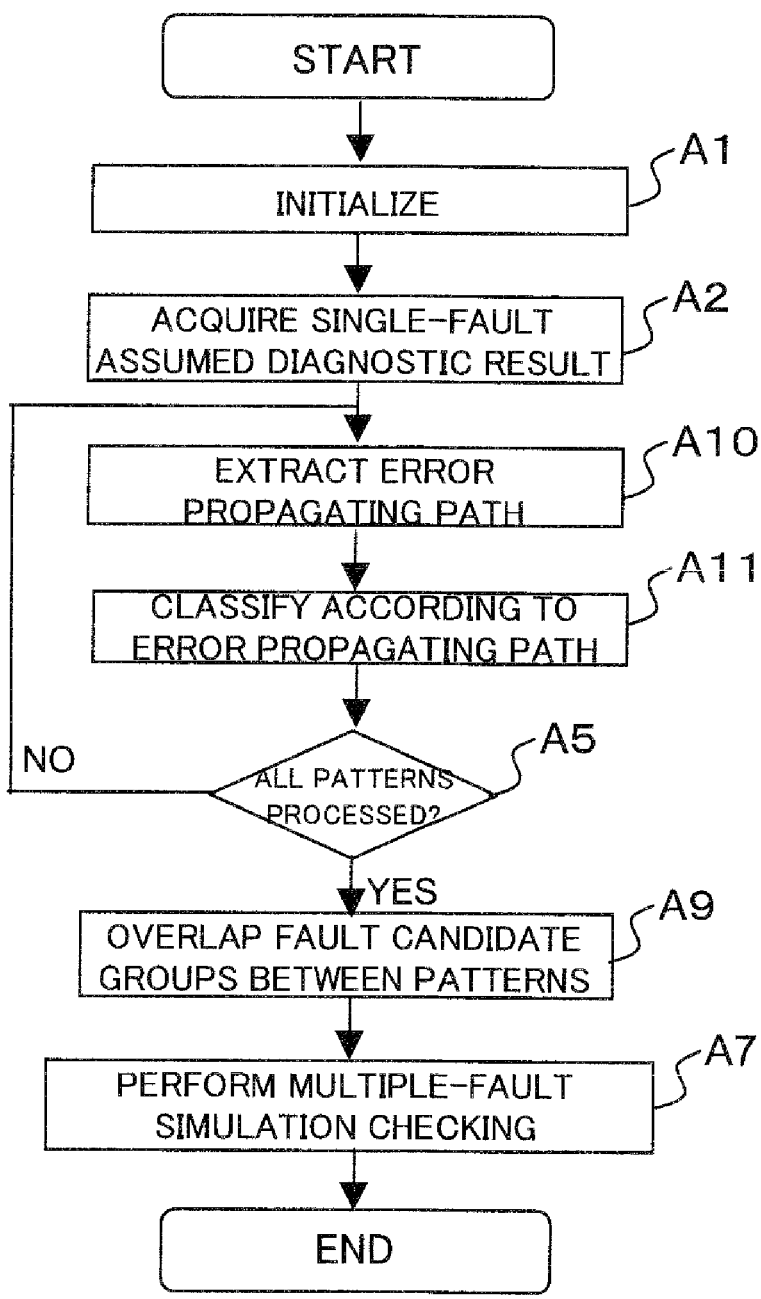
FIG. 8 is a flowchart showing the operation of the third example of the present invention.

FIG. 8 is a flowchart showing the operation of the third example of the present invention. Next, the following describes the operation of the third example of the present invention in detail with reference to FIG. 7 and FIG. 8.

Referring to FIG. 8, the operation of the third example of the present invention is different from the operation shown in FIG. 2 in that the error propagating path extraction operation in step A10 is performed instead of the error-observation node basis classification operation in step A3 shown in FIG. 2 and that error-propagating-path basis classification operation in step A11 is performed instead of the fault candidate group selection operation in step A4.

In step A10, the error propagating path extraction means 29 references
fault candidates and
error output terminal information stored in the single-fault diagnosis result storage unit 42, extracts error propagating paths through which an error propagates to an error output terminal via the fault candidates, and stores the extracted result in the single-fault diagnosis result storage unit 42.

In step A11, the error propagating path classification means 30 references the error propagating path information stored in the single-fault diagnosis result storage unit 42, selects a candidate with a high fault possibility by referencing the scores of the fault candidates, classifies error propagating paths, related to the error propagating path through which the selected fault candidate passes, into an error propagating path group related to the error candidate, and stores the fault candidates in the group in the fault candidate classification storage unit 43 as a fault candidate group.

Figure 9:
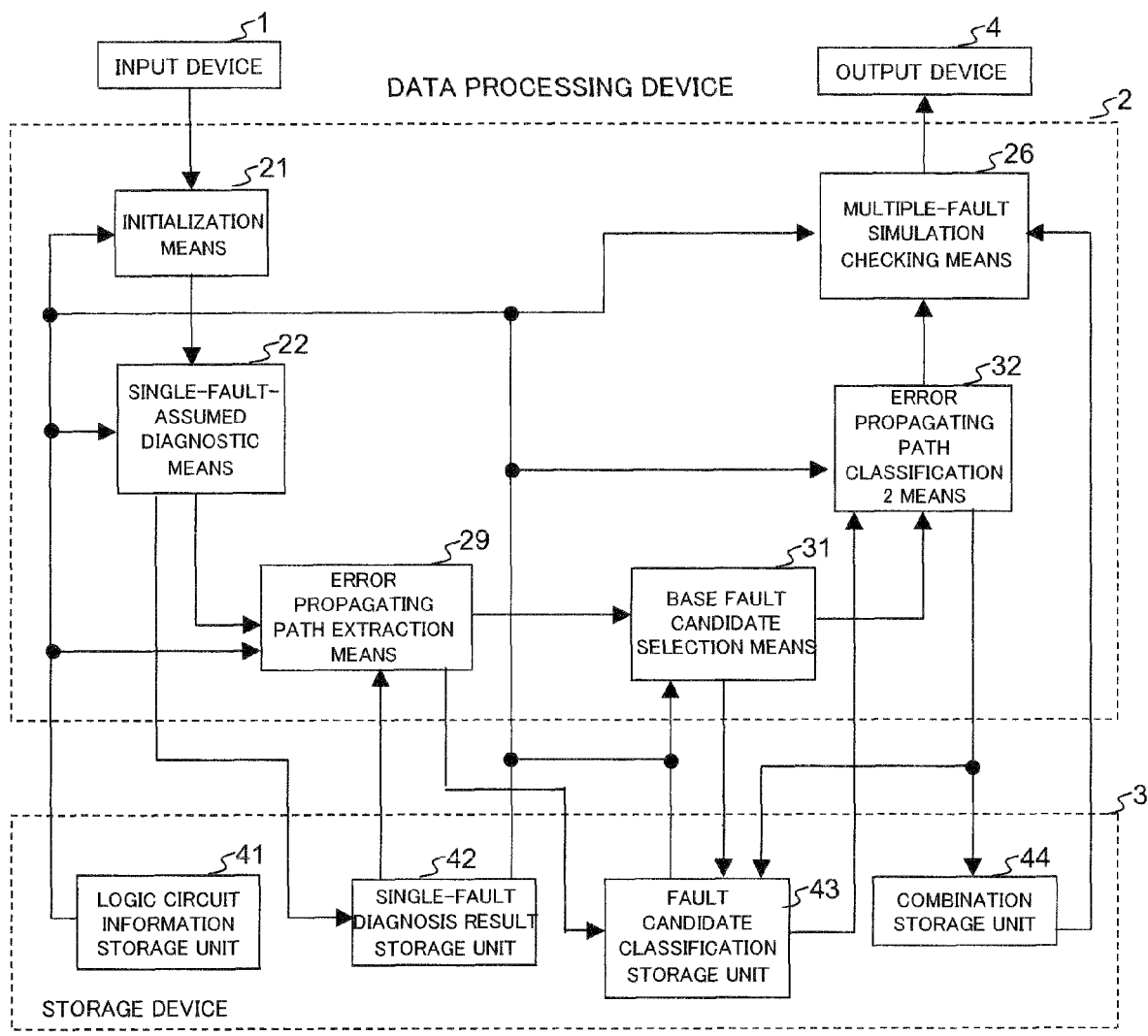
FIG. 9 is a block diagram showing the configuration of a fourth example of the present invention.

FIG. 9 is a block diagram shown the configuration of a fourth example of the present invention. Referring to FIG. 9, the fourth example of the present invention is configured in such a way that, unlike the configuration shown in FIG. 7, a data processing device 2 comprises base fault candidate selection means 31 and error propagating path classification 2 means (second error propagating path classification means) 32. The data processing device 2 does not comprise the error propagating path classification means 30 and the inter-pattern overlapping means 25 shown in FIG. 7.

The base fault candidate selection means 31 uses logic configuration stored in a logic circuit information storage unit 41, and fault candidates, scores of the fault candidates, and path information stored in a single-fault diagnosis result storage unit 42 to select a fault candidate, which has the highest fault possibility, from unselected error propagating paths in all test patterns as a base candidate, and stores it in a fault candidate classification storage unit 43.

The error propagating path classification 2 means 32 references the error propagating path information stored in the single-fault diagnosis result storage unit 42, and classifies the main path, through which the fault reaches the error-observation node via the base candidate selected by the base fault candidate selection means 31, and the branch paths, which are related to the main path, into a path group related to the base candidate, and stores the fault candidate group, which has the highest fault possibility in the path group, in the fault candidate classification storage unit 43.

In addition, if there are unselected error propagating paths, control is passed back to the base fault candidate selection means 31. When the processing for all paths is terminated, the combinations of fault candidates groups are stored in the combination storage unit 44 and control is passed to the processing of the multiple-fault simulation checking means 26.

Figure 10:
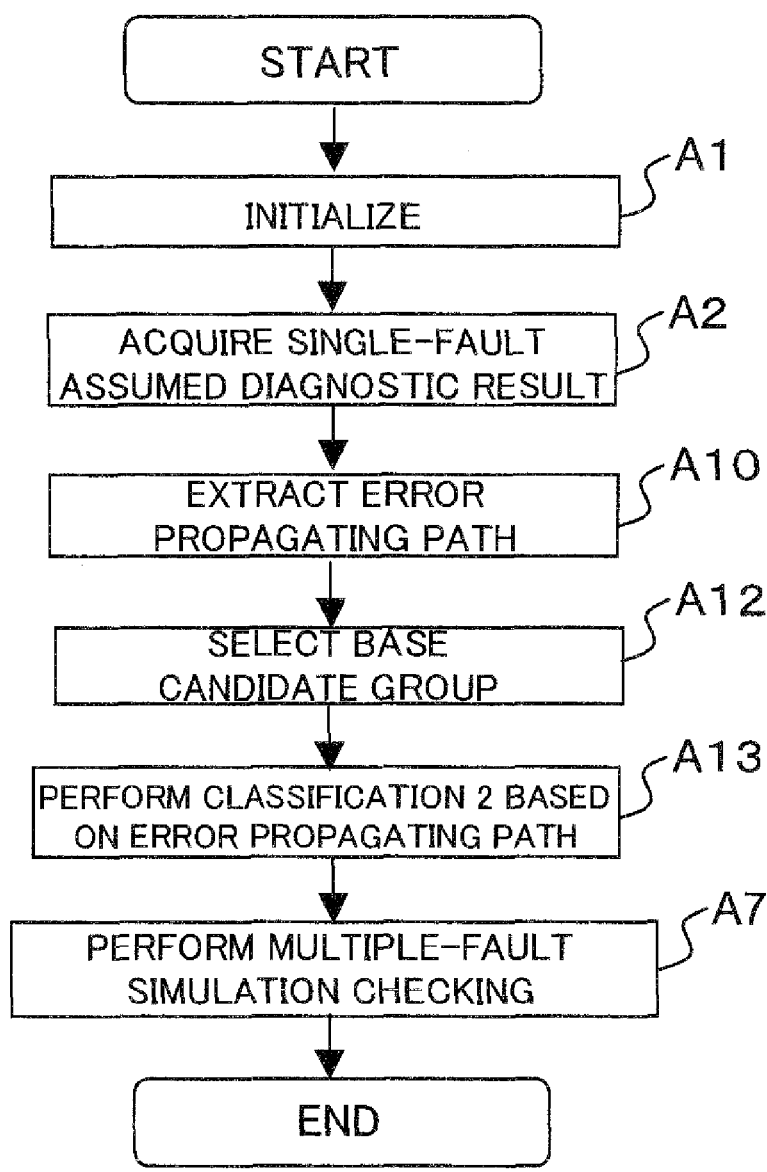
FIG. 10 is a flowchart showing the operation of the fourth example of the present invention.

FIG. 10 is a flowchart showing the operation of the fourth example of the present invention. Next, the following describes the operation of the fourth example of the present invention in detail with reference to FIG. 9 and FIG. 10.

Referring to FIG. 10, the operation of the fourth example of the present invention is different from the operation shown in FIG. 8 in that the base candidate group selection operation in step A12 is performed instead of the error propagating path basis classification operation in step A11 shown in FIG. 8 and that error propagating path basis classification 2 operation in step A13 is performed instead of the inter-pattern overlapping operation in step A9.

That is, the fault locations are narrowed in each pattern and, after that, the pattern information is overlapped by the inter-pattern overlapping means 25 in the first to third examples. On the other hand, in the fourth example of the present invention, the processing is repeated in which a base fault is selected first by referencing the diagnosis result of the single-fault-assumed diagnostic means 22 and the error propagating paths related to the base candidate are grouped in all patterns. This is the difference between the fourth example and the first to third examples.

In step A12, the base fault candidate selection means 31 uses logic configuration stored in the logic circuit information storage unit 41, and fault candidates, scores of the fault candidates, and path information stored in the single-fault diagnosis result storage unit 42 to select a fault candidate, which has the highest fault possibility, from unselected error propagating paths in all test patterns as a base candidate, and stores it in the fault candidate classification storage unit 43.

In step A13, the error propagating path classification 2 means 32 references the fault candidates and the path information stored in the single-fault diagnosis result storage unit 42 and classifies the paths, through which an error propagates from the base candidate, into an error propagating path group by referring to the base information stored in the fault candidate classification storage unit 43, stores the fault candidates, included in the base path in the group, in the fault candidate classification storage unit 43 as a fault candidate group, repeats the grouping operation if there is an unselected base candidate group, and stores the group in the combination storage unit 44. The following describes the examples with reference to examples.

Next, the following describes in detail an example of the first example with reference to FIG. 1, FIG. 3, FIG. 2, FIG. 4, FIG. 11A, FIG. 11B, FIGS. 12A to 12C, and FIG. 17A and FIG. 17B.

The initialization means 21 in FIG. 1 sets the type of a given logic circuit and the logic states of the input/output terminals based on the information received from the input device 1 and the logic circuit information storage unit 41 and initializes the logic states of the signal lines (step A1).

The single-fault-assumed diagnostic means 22 shown in FIG. 1 references the logic circuit information storage unit 41, runs an existing single-fault-assumed fault location estimation system, and stores the diagnosis result indicating narrowed-down fault locations in the circuit (that is, fault candidates, their fault types, and detected error-observation nodes at which an error arrives from the fault candidates) in the single-fault diagnosis result storage unit 42 (step A2).

Figure 11A:
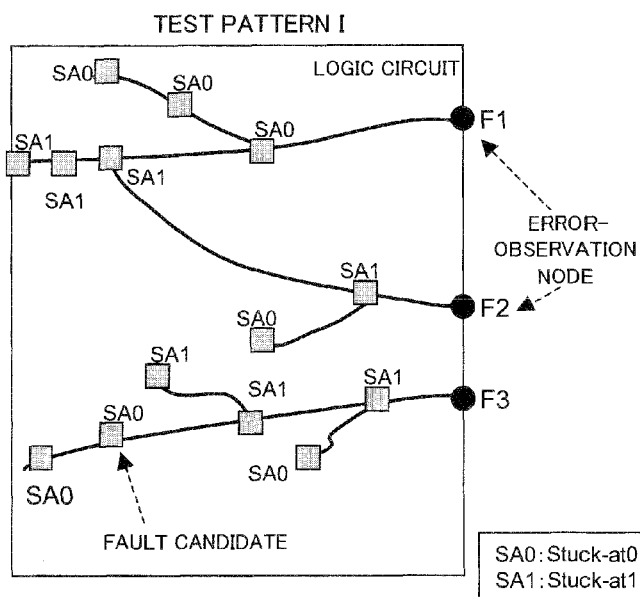
FIGS. 11A and 11B are diagrams showing fault candidates and error-observation nodes generated by assuming a single fault in the example of the operation of the first example of the present invention.
Figure 11B:
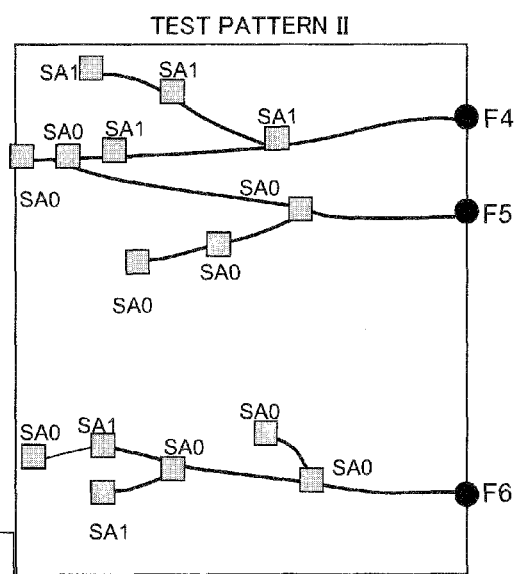

For example, in test patterns I and II, the following information is acquired as shown in FIGS. 11A and 11B:

fault candidates (squares in the figure);

fault types (Stuck-at0 (SA0), Stuck-at1 (SA1)); and error-observed nodes related to the fault candidates.

Next, in step A3, the error-observation node basis candidate classification means 23 uses fault candidates and error-observation nodes stored in the single-fault diagnosis result storage unit 42 to classify the fault candidate groups, for each error-observation node, into fault candidate groups that propagate an error only to the terminal, and fault candidate groups that propagate an error not only to the terminal but also to some other terminal, and stores those groups in the fault candidate classification storage unit 43 as the fault candidate groups.

Figure 12A:
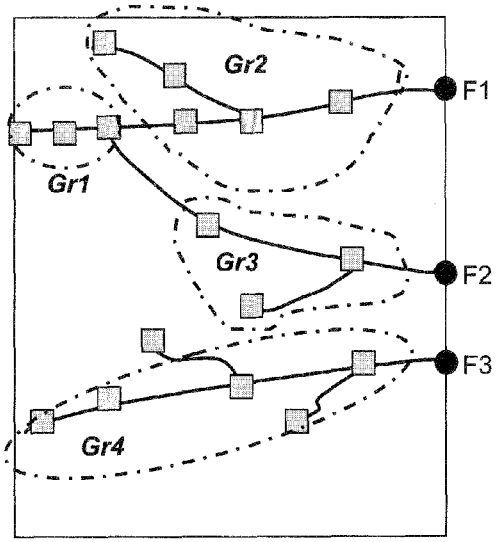
FIGS. 12A to 12C are diagrams showing the method for classifying fault candidates in the example of the operation of the first example of the present invention.
Figure 12B:
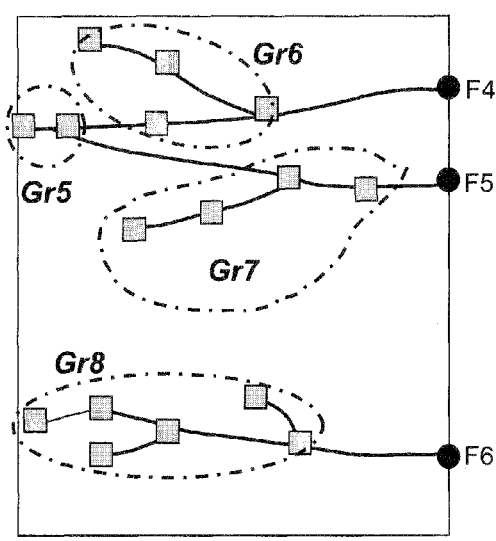
Figure 12C:
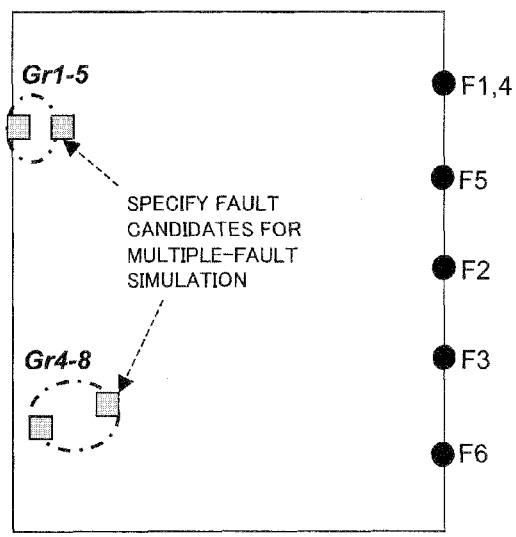

For example, in the test patterns shown in FIG. 12A and FIG. 12B, the fault candidates are classified into the following groups. In test pattern I, the fault candidates are classified into:

fault candidate group Gr1 that propagates an error to error-observation nodes F1 and F2;

fault candidate group Gr2 that propagates an error to error-observation node F1;

fault candidate group Gr3 that propagates an error to error-observation node F2; and fault candidate group Gr4 that propagates an error to error-observation node F3.

In test pattern II, the fault candidates are classified into:

fault candidate group Gr5 that propagates an error to error-observation nodes F4 and F5;

fault candidate group Gr6 that propagates an error to error-observation node F4;

fault candidate group Gr7 that propagates an error to error-observation node F5; and fault candidate group Gr8 that propagates an error to error-observation node F6.

Narrowing down fault candidate groups using the single-fault diagnostic result allows the fault candidates to be classified into groups composed of fault candidates that are more narrowed than those produced by the fan-in trace according to the conventional technology and, so, the number of groups can be reduced.

The acquired diagnostic result gives the propagation paths of fault candidates and so eliminates the need for fault simulation for each signal line, thus greatly improving the diagnostic processing speed.

Next, the inclusion fault candidate group selection means 24 shown in FIG. 1 references logic circuit configuration information stored in the logic circuit information storage unit 41, and fault candidate group information stored in the fault candidate classification storage unit 43, acquires the location relation of the fault candidate groups in the circuit configuration, calculates the inclusion relation among the fault candidate groups, and deletes the inclusion fault candidate groups from the fault candidate classification storage unit 43 (step A4).

For example, in fault candidate groups Gr1-Gr4 of test pattern I in FIG. 12A, fault candidate group Gr1 that propagates an error to error-observation nodes F1 and F2 includes fault candidate group Gr2 that propagates an error only to error-observation node F1 as well as fault candidate group Gr3 that propagates an error only to error-observation node F2. Therefore, fault candidate groups Gr2 and Gr3 are deleted from the fault candidate classification storage unit 43.

Similarly, in test pattern II shown in FIG. 12B, fault candidate groups Gr6 and Gr7 are deleted from the fault candidate classification storage unit 43.

Next, the inter-pattern overlapping means 25 shown in FIG. 1 references the single-fault diagnosis result storage unit 42, and the fault candidate classification storage unit 43, calculates a combination of fault candidate groups that can reproduce the test result stored in the logic circuit information storage unit 41 for all test patterns, and stores the calculated result in the combination storage unit 44. At this time, if there are fault candidate groups that overlap between different patterns, the inter-pattern overlapping means 25 extracts only the common fault candidates to create a new fault candidate group and re-registers the created fault candidate group in the fault candidate classification storage unit 43 (step A6).

For example, in test pattern I in FIG. 12A, fault candidate group Gr1 that propagates an error to error-observation nodes F1 and F2, and fault candidate group Gr4 that propagates an error to F3 are combined into (Gr1, Gr4).

In test pattern II in FIG. 12B, fault candidate group Gr5 that propagates an error to error-observation nodes F4 and F5, and fault candidate group Gr8 that propagates an error to F6 are combined into (Gr5, Gr8).

In this case, if fault candidate groups Gr1 and Gr5 have common fault candidates, the common fault candidate group is created as a new fault candidate group Gr1-5, and if fault candidate groups Gr4 and Gr8 have common fault candidates, the common fault candidate group is created as a new fault candidate group Gr4-8. Those fault candidate groups are re-registered in the fault candidate classification storage unit 43, and a combination of the fault candidate groups (Gr1-5, Gr4-8) is re-registered in the combination storage unit 44.

Next, the multiple-fault simulation checking means 26 shown in FIG. 1 executes step A7. FIG. 3 is a diagram showing the configuration of the multiple-fault simulation checking means 26, and FIG. 4 is a diagram showing the processing procedure of the operation.

Referring to FIG. 4, the multiple-fault candidate selection means 261 first references the fault candidates in the single-fault diagnosis result storage unit 42, fault candidate group information in the fault candidate classification storage unit 43, and combination information in the combination storage unit 44 in step B1, extracts fault candidates, one from each fault candidate group, and calculates a combination of fault candidates.

Figure 17A:
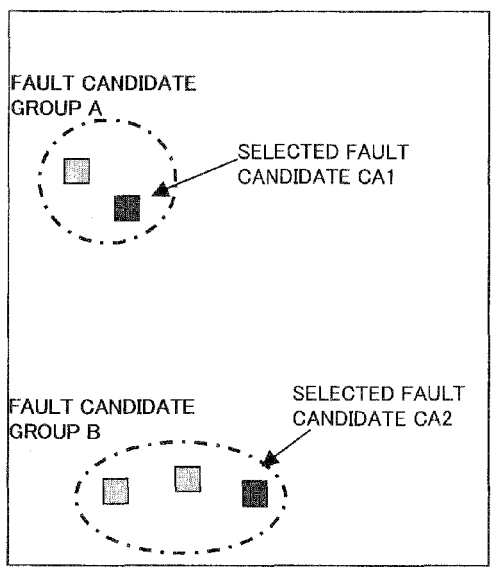
FIGS. 17A and 17B are diagrams showing an example of the operation of the multiple-fault simulation checking means in the examples of the present invention.

For example, when there are fault candidate groups A and B in FIG. 17A, the multiple-fault candidate selection means 261 selects fault candidates arbitrarily, one from each fault candidate group, and calculates a combination of fault candidates (CA1, CA2).

Figure 17B:
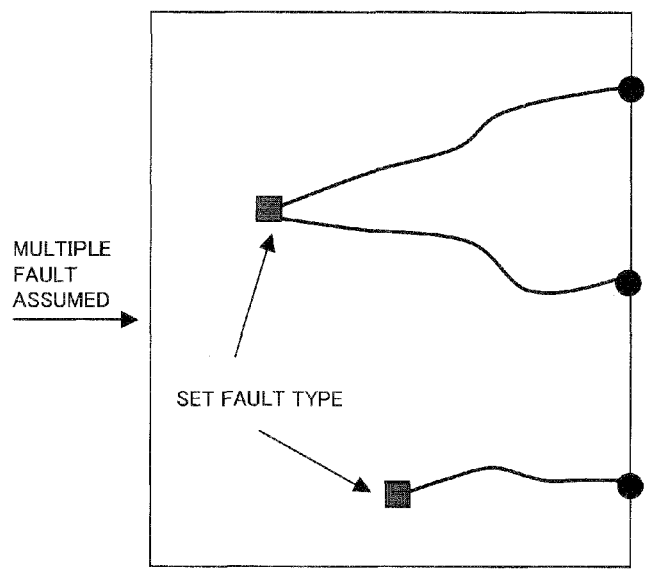

Next, in step B2, the multiple-fault type setting means 262 sets a fault state for the fault candidates in the combination calculated in step B1 by referencing the fault types of the fault candidates in each test pattern stored in the single-fault diagnosis result storage unit 42. In FIGS. 17A and 17B, the logic values of the signal lines of the selected fault candidates CA1 and CA2 are reset according to the fault state stored in the single-fault diagnosis result storage unit 42.

In step B3, the multiple-fault-assumed simulation means 263 executes multiple-fault-assumed simulation, in which the fault states of multiple fault candidates are set at the same time, by referencing the logic circuit information storage unit 41 based on the simulation condition specified in step B1 and step B2 and passes the result to the simulation result checking means 264.

In step B4, the simulation result checking means 264 checks the multiple-fault simulation result and the test result stored in the logic circuit information storage unit 41 to calculate the rate at which they match. In this case, the combination of fault candidates with a high matching rate is determined to be multiple-fault candidates with a high fault possibility. It is also possible to provide a threshold and output a match/mismatch determination result. The matching rate may also be output as the fault possibility degree.

If there is a combination of unselected fault candidates in step B5, control is passed back to step B1 and the processing is repeated from step B1 to step B4 until all combinations of fault candidates are processed.

Because, in FIG. 17A, there are combinations of fault candidates other than the combination of fault candidates CA1 and CA2, another combination is reselected and the processing described above is repeated.

The execution of the multiple-fault simulation and the checking of the simulation result with the test result as described above allow the diagnosis to be made considering the mutual effects of error states generated when multiple faults occur at the same time. This diagnosis, which has been difficult in the conventional technology, ensures multiple-fault diagnosis that is more accurate than the diagnosis of the related art.

Because the fault candidates are classified into groups and, based on the fault candidate groups, the inclusion relations among fault candidate groups are determined and the fault candidate groups are overlapped among the test patterns, the fault candidate groups corresponding to actual fault locations can be output. That is, the number of fault candidate groups that are output indicates the number of actual fault locations, and fault candidates included in each fault candidate group are corresponding actual fault candidates.

Next, the following describes an example of the second example in detail with reference to FIG. 5, FIG. 6, and FIGS. 13A to 13C. In the data processing device 2 in the second example of the present invention, the operations of initialization means 21, inclusion fault candidate group selection means 24, inter-pattern overlapping means 25, and multiple-fault simulation checking means 26 are the same as those in the first example in FIG. 1 and, therefore, the description of the operations is omitted.

First, the storage device 3 in FIG. 5 is different from the storage device 3 in FIG. 1 in that the fault candidate storage unit 45 is provided instead of the single-fault diagnosis result storage unit 42 of the storage device 3 in FIG. 1. The fault candidate storage unit 45 stores fault candidates, fault types, etc. of each circuit group acquired by performing a fault simulation for each signal line.

The operations of fan-in cone classification means 27 and in-node-group fault candidate extraction means 28 are the same as those of the fan-in cone grouping means 27 and the in-node-group fault candidate extraction means 28 in FIG. 19 described in Description of the Related Art. Because no example was described, the following described it in detail.

Figure 13A:
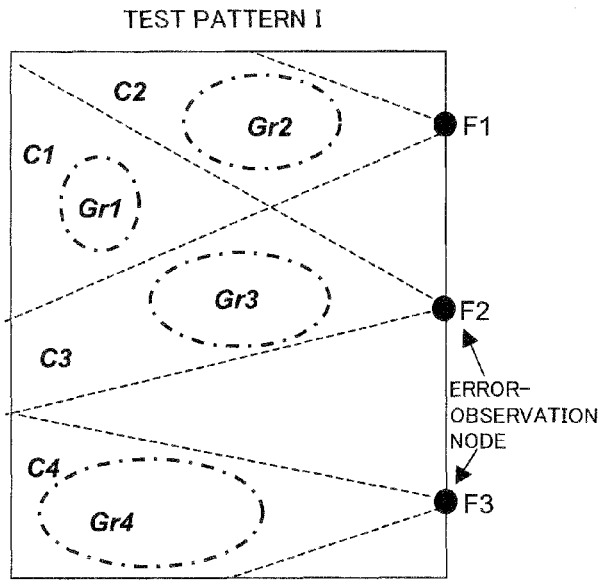
FIGS. 13A to 13C are diagrams showing the method for classifying fault candidates into circuit groups in the example of the operation of the second example of the present invention.
Figure 13B:
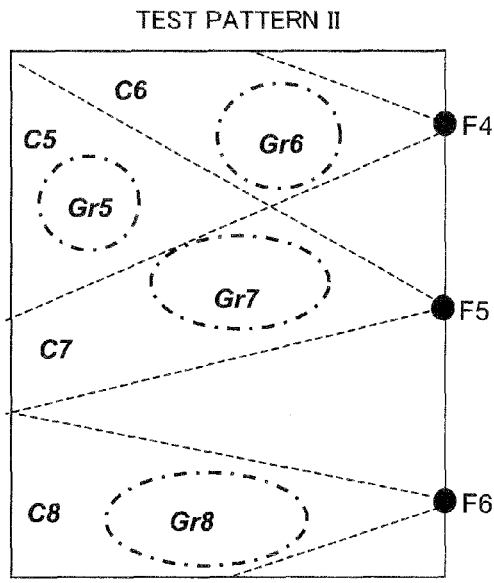
Figure 13C:
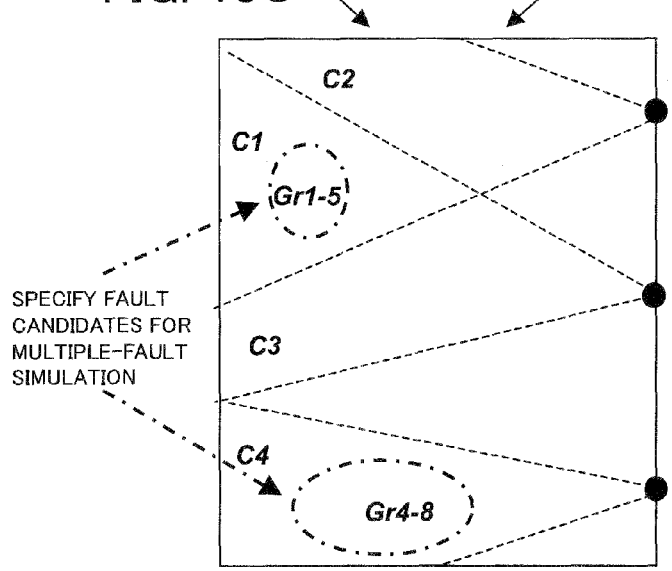
Figure 14A:
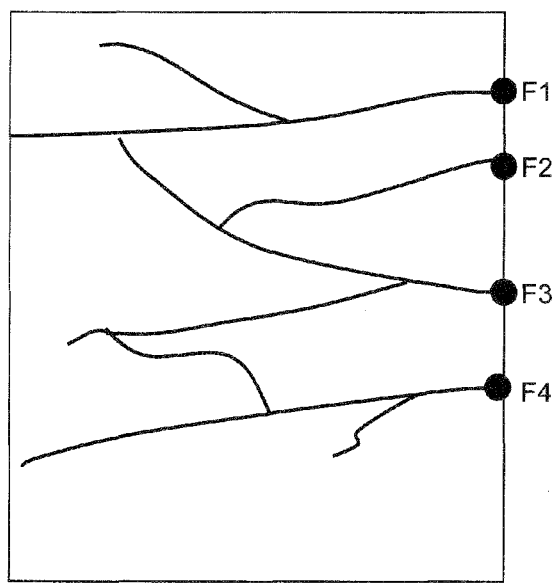
FIGS. 14A and 14B are diagrams showing the error estimation propagating paths in the example of the third example of the present invention.
Figure 14B:
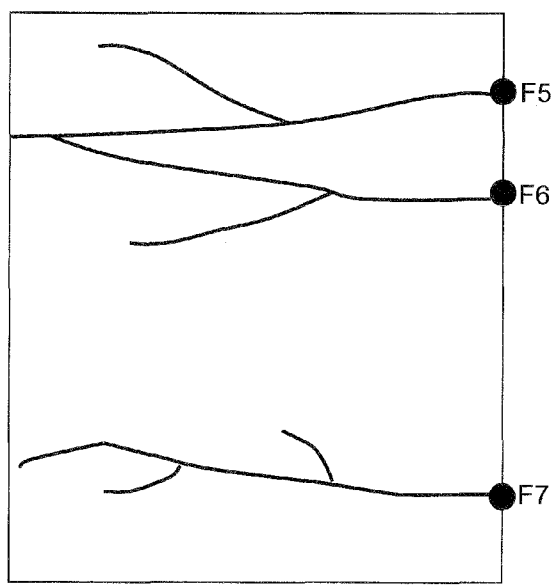

The fan-in cone classification means 27 performs a fan-in trace from all error-observation nodes in a logic circuit, such as the one shown in FIGS. 13A to 13C and, for each error-observation node, classifies the circuit groups into circuit groups that may propagate an error only to each terminal and circuit groups that may propagate an error to multiple terminals (step A8).

For example, FIGS. 13A to 13C show a logic circuit in which there are two faults. In test pattern I in FIG. 13A, an error propagates to terminals F1-F3 and, in test pattern II in FIG. 13B, an error propagates to terminals F4-F6.

In FIG. 13A, a fan-in trace is performed from error-observation nodes F1-F3 to the input side to acquire circuit groups C1-C4. Similarly, in FIG. 13B, circuit groups C5-C8 are acquired from error-observation nodes F4-F6.

The in-node-group fault candidate extraction means 28 references the error-observation nodes, circuit configuration, and signal line logic sates of a test result stored in the logic circuit information storage unit 41 and, with the use of the circuit group information stored in the fault candidate classification storage unit 43 in step A8 described above, performs a single-fault-assumed fault simulation with a 0- or 1-fixed fault assumed for the signal lines in each circuit group. In each test pattern, the in-node-group fault candidate extraction means 28 extracts signal lines through which an error propagates to error-observation nodes, as fault candidates, stores the fault state, assumed for the signal lines at an error detection time, in the fault candidate storage unit 45 as fault types, and stores fault candidates in the same circuit group in the fault candidate classification storage unit 43 as the same fault group (step A9).

For example, the in-node-group fault candidate extraction means 28 performs a single-fault simulation for circuit groups C1-C4 in FIG. 13A with stuck at 0 or 1 faults assumed for signal lines in each circuit group. In test pattern I, the in-node-group fault candidate extraction means 28 finds fault candidate group Gr1, which propagates an error to error-observed terminals F1 and F2, for circuit group C1. Similarly, the in-node-group fault candidate extraction means 28 finds fault candidate group Gr2 for circuit group C2, finds fault candidate group Gr3 for circuit group C3, and finds fault candidate group Gr4 for circuit group C4.

Similarly, in test pattern II in FIG. 13B, the in-node-group fault candidate extraction means 28 finds fault candidate groups Gr5-Gr8.

Next, the following describes in detail an example of the third example of the present invention with reference to FIG. 7, FIG. 8, FIG. 14A, FIG. 14B, and FIGS. 15A to 15C. In the data processing device 2 in the third example of the present invention, the operations of an initialization means 21, single-fault-assumed diagnostic means 22, inter-pattern overlapping means 25, and multiple-fault simulation checking means 26 are the same as those of the means 21, 22, 25, and 26 in the first example in FIG. 1 and, therefore, the description of the operations is omitted. A storage device 3 also has the same configuration as that of the storage device 3 in FIG. 1 and, therefore, the operation is omitted.

In step A10, the error propagating path extraction means 29 references the fault candidates stored in the single-fault diagnosis result storage unit 42 and the error-observation node information, acquires information on the signal lines through which an error propagates from a fault candidate to an error-observation node in each test pattern, and stores the acquired signal line information in the single-fault diagnosis result storage unit 42. For example, in test patterns I and II in FIG. 14A and FIG. 14B, the paths through which an error propagates to an error-observation node are acquired as shown by solid lines.

In step A11, the error propagating path classification means 30 references error propagating path information stored in the single-fault diagnosis result storage unit 42, finds a base path, which is a path through which a fault state propagates to more error-observation nodes, in each test pattern and, in addition, includes the derivative paths, through which the error propagates to the error-observation node related to the base path, into one path group. If there are paths not included in the group, the error propagating path classification means 30 repeats the processing for selecting another base path and creating a path group until all paths belong to one of the groups, and stores the path groups in the combination storage unit 44. After that, the error propagating path classification means 30 selects the fault candidates, which best account for an error-observation node, from the fault candidates in each path group as a fault candidate group and stores it in the fault candidate classification storage unit 43.

Figure 15A:
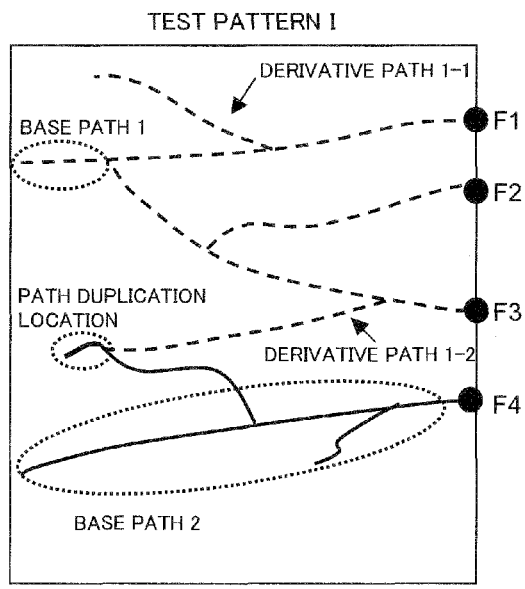
FIGS. 15A to 15C are diagrams showing the method for classifying fault candidates according to error estimation propagating paths in the example of the operation of the third example of the present invention.

For example, in test pattern I in FIG. 15A, the paths are grouped as follows.

First, the path, which accounts for error-observation nodes F1-F3 (path through which an error propagates to F1-F3), is defined as base path 1.

In addition, the path through which an error propagates only to F1, which is a derivative part of base path 1, is defined as derivative path 1-1 and, similarly, the path through which an error propagates only to F3 is defined as derivative path 1-2. Those derivative paths are grouped into the group of base path 1.

The path through which an error propagates to remaining node F4 is defined as, and grouped into, base path 2.

Figure 15B:
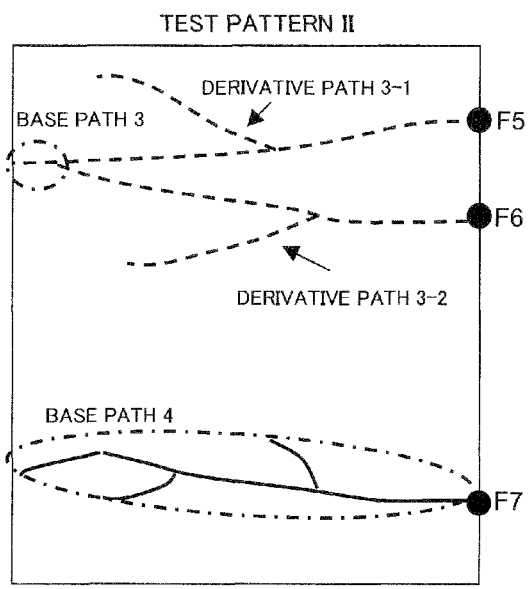
Figure 15C:
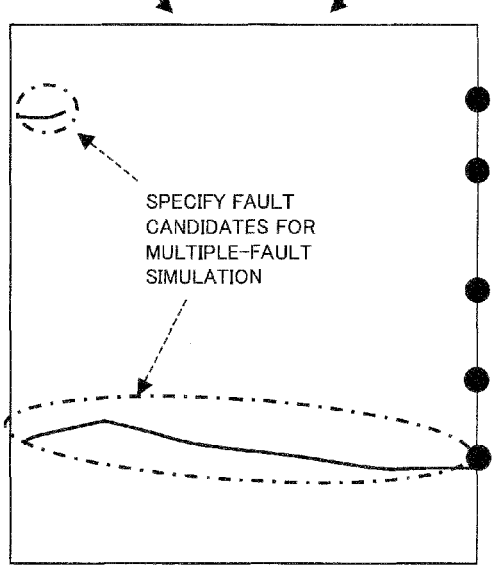

In test pattern II in FIG. 15B, the paths are grouped into base path 3 and base path 4.

In this example, there is a path through which an error propagates to F3 and F4. This path is registered in both groups as a path duplicated location. The fault candidates in a path part shared by the largest number of error propagating paths are stored in the fault candidate classification storage unit 43 as a fault candidate group. Overlapping the fail pattern in FIG. 15A and that in FIG. 15B produces the pattern in FIG. 15C.

Next, the following describes an example of the fourth example in detail with reference to FIG. 9, FIG. 10, and FIGS. 16A to 16D. In the data processing device 2 in the fourth example of the present invention, the operations of initialization means 21, single-fault-assumed diagnostic means 22, error propagating path extraction means 29, and multiple-fault simulation checking means 26 are the same as those of the means 21, 22, 29, and 26 in the third example shown in FIG. 7 and, therefore, the description of the operations is omitted. The configuration of the storage device 3 is also the same as that of the storage device 3 shown in FIG. 7 and, therefore, the description is omitted.

In step A12, the base fault candidate selection means 31 uses logic configuration stored in the logic circuit information storage unit 41 and fault candidates, scores of the fault candidates, and path information stored in the single-fault diagnosis result storage unit 42 to select a fault candidate, which has the highest fault possibility, from unselected error propagating paths in all test patterns as a base candidate and stores it in the fault candidate classification storage unit 43.

Figure 16A:
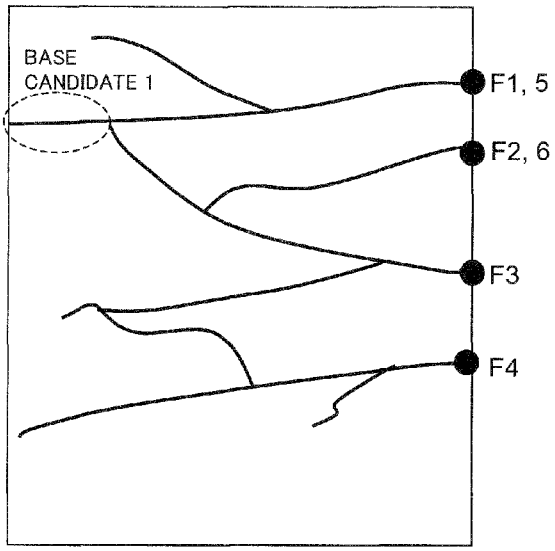
FIGS. 16A to 16D are diagrams showing the method for classifying fault candidates according to error estimation propagating paths in the example of the operation of the fourth example of the present invention.

For example, in FIG. 16A, base candidate 1 through which error-observation nodes F1, F2, F3, F4, F5, and F6 can be reached is a path that has a high fault possibility. So, base candidate 1 is stored in the fault candidate classification storage unit 43.

In step A13, the error propagating path classification 2 means 32 references the error propagating path information stored in the single-fault diagnosis result storage unit 42 and classifies the main path, through which the fault reaches the error-observation node via the base candidate selected by the base fault candidate selection means 31, and the branch paths, which are related to the main path, into path group 1 related to the base candidate, and stores the fault candidate group, which has the highest fault possibility in path group 1, in the fault candidate classification storage unit 43. In addition, if there are unselected error propagating paths, control is passed back to the base candidate group selection processing in step A12. When the processing for all paths is terminated, the combinations of fault candidates groups are stored in the combination storage unit 44 and control is passed to the multiple-fault simulation checking processing in step A10.

Figure 16B:
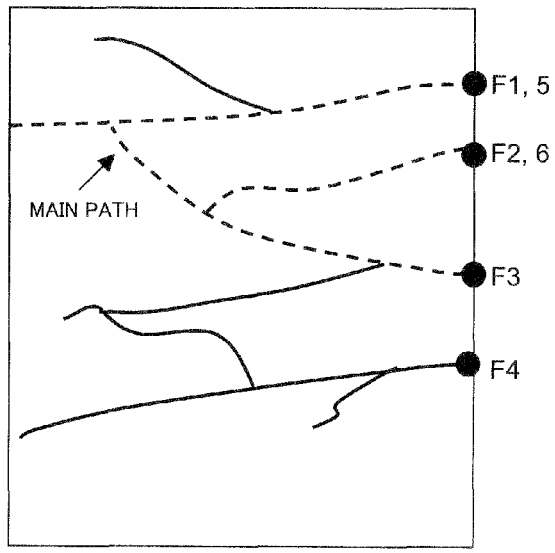

For example, in FIG. 16B, the path (the path indicated by the broken line in the figure), through which an error propagates to error-observation nodes F1, F2, F3, F5, and F6 via base candidate 1, is the main path.

Figure 16C:
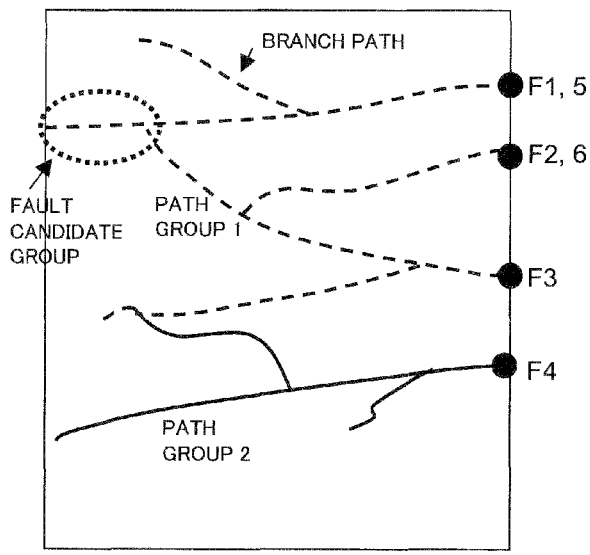

Next, in FIG. 16C, the paths indicated by the broken line, including the branch paths related to the main path, are classified into a path group related to a base candidate, and the fault candidate group (the part indicated by the dotted line in the figure), which has the highest fault possibility in the path group, is stored in the fault candidate classification storage unit 43. Because there is an unselected path in FIG. 16C, control is passed back to the base point candidate group selection processing in step A12.

In step A12, base candidate 2 on the unselected path (solid line part in the figure) in FIG. 16C, which accounts for error-observation node F4 that is not yet accounted for, is selected as base candidate 2 and is stored in the fault candidate classification storage unit 43.

In addition, the main path and the branch paths related to base candidate 2 are grouped into path group 2, related to base candidate 2, in step A13 as described above, and the fault candidate group, which has the highest fault possibility in path group 2, is stored in the fault candidate classification storage unit 43.

Because all paths are classified into groups, combinations of fault candidate groups of path group 1 and path group 2 are recorded in the combination storage unit 44.

In FIG. 16C, there are paths through which an error signal propagates to both error-observation nodes F3 and F4. This part belongs to both path group 1 and path group 2 as a path duplication location.

The conventional technology, which combines the results of single-fault simulation for the fault candidates to verify multiple fault candidates, does not take into consideration a case where the error propagating paths of multiple faults affect each other.

Figure 16D:
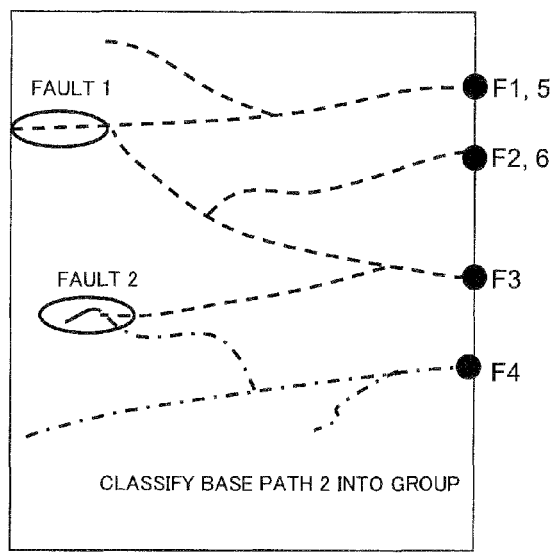

The system according to the present invention, which classifies fault candidates into path groups and performs multiple-fault simulation, can be applied to a case where the error propagating paths of multiple faults affect each other. For example, if fault 1 and fault 2 in FIG. 16D are actual faults, fault 1 is in a fault candidate group of path group 1 and fault 2 is included in a fault candidate group of path group 2. In addition, because path groups are classified with consideration for a case where error propagating paths affect each other, the checking via multiple-fault simulation is not necessary in many cases.

The first, third, and fourth examples that include single-fault-assumed diagnostic means allow a system to be implemented where the single-fault diagnosis and the multiple-fault diagnosis are performed at the same time to output the candidates found by both diagnoses.

Figures 18A, 18B, 18C:
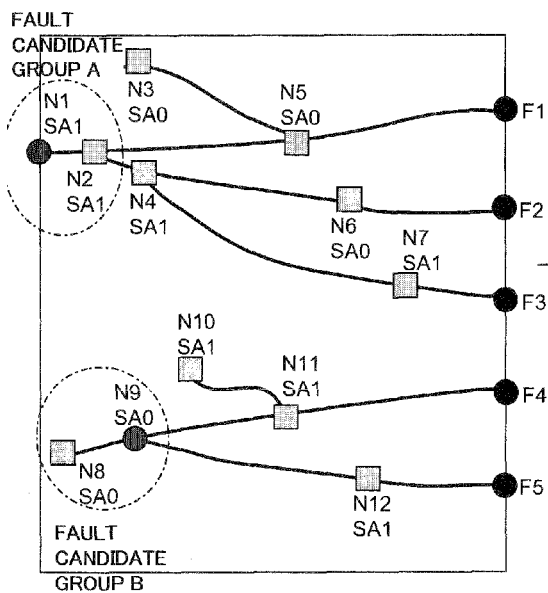
FIGS. 18A to 18C are diagrams showing an output example of the multiple-fault diagnosis result obtained by carrying out the present invention.

FIGS. 18A to 18C show an example of a result diagnosed by the multiple-fault location estimation system according to the present invention. For example, FIG. 18A shows an example of a sample in which there are two actual faults (indicated by circles) in a logic circuit and the single-fault-assumed diagnosis is performed for error-observation nodes F1-F5 to acquire fault candidates N1-N12 (indicated by squares).

FIG. 18B shows the result of the single-fault-assumed diagnosis where the fault candidates, which can reproduce F1, F2, and F3, are arranged in descending order of scores, beginning with N1 that has the highest score. In this example, actual fault N9 with the score of 2 ranks low because of a light weight and, in addition, there is fault candidate N4 that is another fault candidate with the score of 2 but does not belong to any fault candidate group. Therefore, it is highly possible that actual fault N9 is looked over.

On the other hand, FIG. 18C shows an example of the result produced by the multiple-fault location estimation system according to the present invention. As shown in this output example, the system selects the locations, with a high fault possibility, from the grouped result and extracts them as fault candidate groups. Thus, the system allows each fault candidate group to correspond to actual faults and removes the fault candidates with a low fault possibility. The diagnosis result, which is output to each fault candidate group, makes it easy to limit the range of actual faults and makes it easy to select analysis locations in an actual analysis.

In the related art, only the combinations of fault candidates are output including candidates with a low fault possibility. This makes it very difficult in an actual analysis to select fault candidates from (N1,N8), (N1,N9), (N2,N8), (N2,N9), (N3, N4,N8), etc.

The present invention can be applied to a fault estimation device that estimates multiple-fault locations from logic circuit information and a test result and to a program that causes a computer to implement an error estimation device. While the present invention has been described with reference to the examples above, it is to be understood that the present invention is not limited to the configuration of the examples above and that modifications and changes that may be made by those skilled in the art within the scope of the present invention are included.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A fault location estimation system that is implemented by a data processing device and that estimates fault location in a logic circuit, said system comprising:

means that classifies locations with a high fault possibility into groups based on error-observation node information acquired from a test result of the logic circuit and that performs fault simulation for confirming and estimating a plurality of fault locations;

output means that outputs single-fault estimation results and multiple-fault estimation results, that is, a number of fault candidate groups corresponding to a number of multiple actual faults, fault candidate groups corresponding to each of actual faults, fault candidates included in a fault candidate group, and a fault type of each fault candidate;

single-fault-assumed diagnostic means that narrows fault locations in the logic circuit assuming a single fault by referencing logic circuit configuration information and signal line expected values stored in a logic circuit information storage unit and that stores fault candidates in the logic circuit, types of the faults, and detected error-observation nodes at which an error arrives from the fault candidates, which are a result of narrowing the fault locations, into a single-fault diagnosis result storage unit;

error-observation node basis classification means that classifies error propagating fault candidates into groups according to the error-observation nodes using the fault candidates and the error-observation nodes stored in said single-fault diagnosis result storage unit and stores the groups in a fault candidate classification storage unit as fault candidate groups;

inclusion fault candidate group selection means that acquires a relation between each fault candidate group and a fault output by referencing the logic circuit configuration information and the fault candidate groups stored in said fault candidate classification storage unit, calculates an inclusion relation among the fault candidate groups, and extracts common candidates; and inter-pattern overlapping means that calculates combinations of the fault candidate groups that can reproduce the test result in all test patterns by referencing the fault candidates in said single-fault diagnosis result storage unit and the fault candidate groups in said fault candidate classification storage unit, stores the calculated combinations in a combination storage unit and, if there are common fault candidates in the calculated fault candidate groups, extracts the common fault candidates and re-registers the common fault candidates in said fault candidate classification storage unit as a new fault candidate group.

2. The fault location estimation system according to claim 1, further comprising:

multiple-fault simulation checking means that references said logic circuit information storage unit, said single-fault diagnosis result storage unit, said fault candidate classification storage unit, and said combination storage unit to reference the logic circuit configuration information, the signal line expected values, the fault candidates, the fault types of the fault candidates, the fault candidate group information, and the combination information on the fault candidate group information, selects fault candidates from the combinations of the fault candidate groups, one from each fault candidate group, and performs multiple-fault simulation assuming a fault based on the fault types of the selected fault candidates, and compares the simulation result with the test result and outputs a combination of the fault candidate groups, which matches relatively well with the test result and has a relatively high fault possibility, as well as the fault types of the fault candidates included in the combination of the fault candidate groups.

3. The fault location estimation system according to claim 1, comprising:

fan-in cone classification means that performs a fan-in trace from error-observation nodes by referencing logical circuit configuration information stored in a logic circuit information storage unit, classifies traced in-circuit nodes into groups according to error-observation nodes, and stores the grouped result in a fault candidate storage unit;

in-node-group fault candidate extraction means that extracts signal lines for each node group by referencing the logic circuit configuration information and signal line expected values stored in said logic circuit information storage unit and the node groups related to the error-observation nodes stored in said fault candidate storage unit, performs single-fault simulation assuming a fault by referencing signal line logic states, and stores signal lines, through which a fault propagates to the error-observation nodes related to the node groups, in a fault candidate classification storage unit as fault candidates;

inclusion fault candidate group selection means that acquires a relation between each fault candidate group and a fault output by referencing the logic circuit configuration information stored in said logic circuit information storage unit and fault candidate group information stored in said fault candidate classification storage unit, calculates an inclusion relation among the fault candidate groups, and extracts common candidates; and inter-pattern overlapping means that calculates combinations of the fault candidate groups that can reproduce the test result in all test patterns by referencing the fault candidates in said fault candidate storage unit and the fault candidate groups in said fault candidate classification storage unit, stores the calculated combinations in a combination storage unit and, if there are common fault candidates in the calculated fault candidate groups, extracts only the common fault candidates and re-registers the common fault candidates in said fault candidate classification storage unit as a new fault candidate group.

4. The fault location estimation system according to claim 3, further comprising:

multiple-fault simulation checking means that references said logic circuit information storage unit, said fault candidate storage unit, said fault candidate classification storage unit, and said combination storage unit to reference the logic circuit configuration information, the signal line expected values, the fault candidates, the fault types of the fault candidates, the fault candidate group information, and the combination information on the fault candidate group information, selects fault candidates from the combinations of the fault candidate groups, one from each fault candidate group, and performs multiple-fault simulation assuming a fault based on the fault types of the selected fault candidates, compares the simulation result with the test result, and outputs a combination of the fault candidate groups, which matches relatively well with the test result and has a relatively high fault possibility, as well as the fault types of the fault candidates included in the combination of the fault candidate groups.

5. The fault location estimation system according to claim 1, comprising:

single-fault-assumed diagnostic means that assumes a single fault by referencing logic circuit configuration information and signal line expected values stored in a logic circuit information storage unit and that stores fault candidates in the logic circuit, fault types of the fault candidates, and detected error-observation nodes, at which an error arrives from the fault candidates, into a single-fault diagnosis result storage unit;

error propagating path extraction means that extracts error propagating paths to an error-observation node through each fault candidate using the logic circuit configuration information and signal line expected values stored in said logic circuit information storage unit and the fault candidates and error-observation nodes stored in said single-fault diagnosis result storage unit and stores the extracted error propagating paths in a fault candidate classification storage unit as error propagating path information;

error propagating path classification means that selects a candidate with a relatively high fault possibility considering scores of the fault candidates by referencing the fault candidates stored in said single-fault diagnosis result storage unit and the error propagating path information stored in said fault candidate classification storage unit, classifies error propagating paths, related to an error propagating path through which the selected fault candidate passes, into an error propagating path group related to the fault candidate, and stores fault candidates in the group in said fault candidate classification storage unit as a fault candidate group; and inter-pattern overlapping means that calculates combinations of the fault candidate groups that can reproduce the test result in all test patterns by referencing the logic circuit configuration information stored in said logic circuit information storage unit, the fault candidates stored in said single-fault diagnosis result storage unit, and the fault candidate groups stored in said fault candidate classification storage unit, stores the calculated combinations in a combination storage unit and, if there are common fault candidates in the calculated fault candidate groups, extracts only the common fault candidates and re-registers the common fault candidates in said fault candidate classification storage unit as a new fault candidate group.

6. The fault location estimation system according to claim 5, further comprising:

multiple-fault simulation checking means that references said logic circuit information storage unit, said single-fault diagnosis result storage unit, said fault candidate classification storage unit, and said combination storage unit to reference the logic circuit configuration information, the signal line expected values, the fault candidates, the fault types of the fault candidates, the fault candidate group information, and the combination information on the fault candidate group information, selects fault candidates from the combinations of the fault candidate groups, one from each fault candidate group, performs multiple-fault simulation assuming a fault based on the fault types of the selected fault candidates, compares the simulation result with the test result, and outputs a combination of the fault candidate groups which matches relatively well with the test result and has a relatively high fault possibility, as well as the fault types of the fault candidates included in the combination of the fault candidate groups.

7. The fault location estimation system according to claim 1, comprising:

single-fault-assumed diagnostic means that assumes a single fault by referencing logic circuit configuration information and signal line expected values stored in a logic circuit information storage unit and that stores fault candidates in the logic circuit, fault types of the fault candidates, and detected error-observation nodes, at which an error arrives from the fault candidates, into a single-fault diagnosis result storage unit;

error propagating path extraction means that extracts error propagating paths to an error-observation node through each fault candidate using the logic circuit configuration information and signal line expected values stored in said logic circuit information storage unit and the fault candidates and error-observation nodes stored in said single-fault diagnosis result storage unit and stores the extracted error propagating paths in a fault candidate classification storage unit as error propagating path information;

base fault candidate extraction means that uses the logic circuit configuration information stored in said logic circuit information storage unit, the fault candidates and scores of the fault candidates stored in said single-fault diagnosis result storage unit, and the error propagating path information stored in said fault candidate classification storage unit to extract an error propagating path, which has the highest fault possibility, from un-extracted error propagating paths in all test patterns and stores base information in said fault candidate classification storage unit as a base candidate group; and second error propagating path classification means that classifies the paths, through which an error propagates from the base candidate group, into an error propagating path group by referencing the fault candidates and error propagating path information and by referring to the base information, stores fault candidates, included in a base path in the group, in the combination storage unit as a fault candidate group and, if there is an unselected base candidate group, repeats the grouping operation.

8. The fault location estimation system according to claim 7, further comprising:

multiple-fault simulation checking means that references said logic circuit information storage unit, said single-fault diagnosis result storage unit, said fault candidate classification storage unit, and said combination storage unit to reference the logic circuit configuration information, the signal line expected values, the fault candidates, the fault types of the fault candidates, the fault candidate group information, and combination information on the fault candidate group information, selects fault candidates from combinations of the fault candidate groups, one from each fault candidate group, performs multiple-fault simulation assuming a fault based on the fault types of the selected fault candidates, compares the simulation result with the test result, and outputs a combination of the fault candidate groups which matches relatively well with the test result and has a relatively high fault possibility, as well as the fault types of the fault candidates included in the combination of the fault candidate groups.

9. The fault location estimation system according to claim 1, wherein said output means outputs, relating multiple fault assumed estimation result, a list of candidate name, fault type and score in each of fault candidate groups.

10. A data process device implemented method of estimating fault location in a logic circuit, said method comprising:
classifying locations with a high fault possibility into groups based on error-observation node information acquired from a test result of the logic circuit and that performs fault simulation for confirming and estimating a plurality of fault locations;
outputting single-fault estimation results and multiple-fault estimation results, that is, a number of fault candidate groups corresponding to a number of multiple actual faults, fault candidate groups corresponding to each of actual faults, fault candidates included in a fault candidate group, and a fault type of each fault candidate;
a single-fault-assumed diagnostic step that assumes a single fault and stores fault candidates in the logic circuit, fault types of the fault candidates, and error-observation nodes at which an error arrives from the fault candidates by referencing logic circuit configuration information and signal line expected values;
an error-observation node basis classification step that classifies the fault candidates into groups according to the error-observation nodes using the logic circuit configuration information, the fault candidates, and the error-observation node information and stores the groups in a fault candidate classification storage unit as fault candidate groups;
an inclusion fault candidate group selection step that acquires a relation between each fault candidate group and a fault output by referencing the logic circuit configuration information and the fault candidate group information, calculates an inclusion relation among the fault candidate groups, and extracts common candidates; and
an inter-pattern overlapping step that calculates combinations of the fault candidate groups that can reproduce the test result in all test patterns by referencing the fault candidates and the fault candidate groups, and, if there are common fault candidates in the calculated fault candidate groups, extracts only the common fault candidates and re-registers the common fault candidates as a new fault candidate group.

11. The method according to claim 10, further comprising:
a multiple-fault simulation checking step that references the logic circuit configuration information, the signal line expected values, the fault candidates, the fault types of the fault candidates, the fault candidate group information, and the combination information on the fault candidate group information, selects fault candidates from the combinations of the fault candidate groups, one from each fault candidate group, performs multiple-fault simulation assuming a fault based on the fault types of the selected fault candidates, compares the simulation result with the test result, and outputs a combination of the fault candidate groups, which matches relatively well with the test result and has a relatively high fault possibility, as well as the fault types of the fault candidates included in the combination of the fault candidate groups.

12. The method according to claim 10, comprising:
a fan-in cone classification step that performs a fan-in trace from error-observation nodes by referencing logical circuit configuration information, classifies traced in-circuit nodes into groups according to error-observation nodes, and stores the grouped result;
an in-node-group fault candidate extraction step that extracts signal lines for each node group by referencing the logic circuit configuration information, signal line expected values, and the node groups related to the error-observation nodes, performs single-fault simulation assuming a fault by referencing signal line logic states, and stores signal lines, through which a fault propagates to the error-observation nodes related to the node groups, as fault candidates;
an inclusion fault candidate group selection step that acquires a relation between each fault candidate group and a fault output by referencing the logic circuit configuration information and fault candidate group information, calculates an inclusion relation among the fault candidate groups, and extracts common candidates; and
an inter-pattern overlapping step that calculates combinations of the fault candidate groups that can reproduce the test result in all test patterns by referencing the fault candidates and the fault candidate groups and, if there are common fault candidates in the calculated fault candidate groups, extracts only the common fault candidates and re-registers the common fault candidates as a new fault candidate group.

13. The method according to claim 10, comprising:
a single-fault-assumed diagnostic step that assumes a single fault by referencing logic circuit configuration information and signal line expected values and that stores fault candidates in the logic circuit, fault types of the fault candidates, and detected error-observation nodes at which an error arrives from the fault candidates;
an error propagating path extraction step that extracts error propagating paths to an error-observation node through each fault candidate using the logic circuit configuration information, signal line expected values, fault candidates, and error-observation nodes and stores the extracted error propagating paths as error propagating path information;
an error propagating path classification step that selects a candidate with a relatively high fault possibility considering scores of the fault candidates by referencing the fault candidates and the error propagating path information, classifies error propagating paths, related to an error propagating path through which the selected fault candidate passes, into an error propagating path group related to the fault candidate, and stores fault candidates in the group as a fault candidate group; and
an inter-pattern overlapping step that calculates combinations of the fault candidate groups that can reproduce the test result in all test patterns by referencing the fault candidates and the fault candidate groups and, if there are common fault candidates in the calculated fault candidate groups, extracts only the common fault candidates, and re-registers the common fault candidates as a new fault candidate group.

14. The method according to claim 10, comprising:

a single-fault-assumed diagnostic step that assumes a single fault by referencing logic circuit configuration information and signal line expected values and that stores fault candidates in the logic circuit, fault types of the fault candidates, and detected error-observation nodes, at which an error arrives from the fault candidates;

an error propagating path extraction step that extracts error propagating paths to an error-observation node through each fault candidate using the logic circuit configuration information, the signal line expected values, the fault candidates, and the error-observation nodes and stores the extracted error propagating paths as error propagating path information;

a base fault candidate extraction step that uses the logic circuit configuration information, the fault candidates, scores of the fault candidates, and the error propagating path information to extract an error propagating path, which has the highest fault possibility, from un-extracted error propagating paths in all test patterns and stores base information in said fault candidate classification storage unit as a base candidate group; and a second error propagating path classification step that classifies the paths, through which an error propagates from the base candidate group, into an error propagating path group by referencing the fault candidates and error propagating path information and by referring to the base information, stores fault candidates, included in a base path in the group, as a fault candidate group and, if there is an unselected base candidate group, repeats the grouping operation.

15. The method according to claim 10, wherein relating multiple fault assumed estimation result, a list of candidate name, fault type and score is output in each of fault candidate groups.

16. A program embodied on a non-transitory computer readable medium and causing a computer to estimate fault locations in a logic circuit, said program causing said computer to execute the processing of:

classifying locations with a high fault possibility into groups based on error-observation node information acquired from a test result of the logic circuit and performing fault simulation for confirming and estimating a plurality of fault locations;

outputting single-fault estimation results and multiple-fault estimation results, that is, a number of fault candidate groups corresponding to a number of multiple actual faults, fault candidate groups corresponding to each of actual faults, fault candidates included in a fault candidate group, and a fault type of each fault candidate;

a single-fault-assumed diagnostic process that narrows fault locations in the logic circuit assuming a single fault by referencing logic circuit configuration information and signal line expected values and that stores fault candidates in the logic circuit, types of the faults, and detected error-observation nodes at which an error arrives from the fault candidates which are a result of narrowing the fault locations;

an error-observation node basis classification process that classifies the fault candidates into groups according to the error-observation nodes using the logic circuit configuration information, the fault candidates acquired from a medium in which the fault candidates are stored by an existing fault location estimation method, and the error-observation node information and stores the groups in a fault candidate classification storage unit as fault candidate groups;

an inclusion fault candidate group selection process that acquires a relation between each fault candidate group and a fault output by referencing the logic circuit configuration information and the fault candidate group information, calculates an inclusion relation among the fault candidate groups, and extracts common candidates; and an inter-pattern overlapping process that calculates combinations of the fault candidate groups that can reproduce the test result in all test patterns by referencing the fault candidates and the fault candidate groups and, if there are common fault candidates in the calculated fault candidate groups, extracts only the common fault candidates and re-registers the common fault candidates as a new fault candidate group.

17. The program according to claim 16, further causing said computer to execute:

a multiple-fault simulation checking process that references the logic circuit configuration information, the signal line expected values, the fault candidates, the fault types of the fault candidates, the fault candidate group information, and the combination information on the fault candidate group information, selects fault candidates from the combinations of the fault candidate groups, one from each fault candidate group, performs multiple-fault simulation assuming a fault based on the fault types of the selected fault candidates, compares the simulation result with the test result, and outputs a combination of the fault candidate groups, which matches relatively well with the test result and has a relatively high fault possibility, as well as the fault types of the fault candidates included in the combination of the fault candidate groups.

18. The program according to claim 16, causing said computer to execute:

a fan-in cone classification process that performs a fan-in trace from error-observation nodes by referencing logical circuit configuration information, classifies traced in-circuit nodes into groups according to error-observation nodes, and stores the grouped result;

an in-node-group fault candidate extraction process that extracts signal lines for each node group by referencing the logic circuit configuration information, signal line expected values, and the node groups related to the error-observation nodes, performs single-fault simulation assuming a fault by referencing signal line logic states, and stores signal lines, through which a fault propagates to the error-observation nodes related to the node groups, as fault candidates;

an inclusion fault candidate group selection process that acquires a relation between each fault candidate group and a fault output by referencing the logic circuit configuration information and fault candidate group information, calculates an inclusion relation among the fault candidate groups, and extracts common candidates; and an inter-pattern overlapping process that calculates combinations of the fault candidate groups that can reproduce the test result in all test patterns by referencing the fault candidates and the fault candidate groups and, if there are common fault candidates in the calculated fault candidate groups, extracts only the common fault candidates and re-registers the common fault candidates as a new fault candidate group.

19. The program according to claim 16, causing said computer to execute:

a single-fault-assumed diagnostic process that assumes a single fault by referencing logic circuit configuration information and signal line expected values and that stores fault candidates in the logic circuit, fault types of the fault candidates, and detected error-observation nodes at which an error arrives from the fault candidates;

an error propagating path extraction process that extracts error propagating paths to an error-observation node through each fault candidate using the logic circuit configuration information, signal line expected values, fault candidates, and error-observation nodes and stores the extracted error propagating paths as error propagating path information;

an error propagating path classification process that selects a candidate with a relatively high fault possibility considering scores of the fault candidates by referencing the fault candidates and the error propagating path information, classifies error propagating paths, related to an error propagating path through which the selected fault candidate passes, into an error propagating path group related to the fault candidate, and stores fault candidates in the group as a fault candidate group; and an inter-pattern overlapping process that calculates combinations of the fault candidate groups that can reproduce the test result in all test patterns by referencing the fault candidates and the fault candidate groups and, if there are common fault candidates in the calculated fault candidate groups, extracts only the common fault candidates, and re-registers the common fault candidates as a new fault candidate group.

20. The program according to claim 16, causing said computer to execute:

a single-fault-assumed diagnostic process that uses a program, which executes an existing single-fault location estimation method, by referencing logic circuit configuration information and signal line expected values and that stores fault candidates in the logic circuit, fault types of the fault candidates, and detected error-observation nodes, at which an error arrives from the fault candidates;

an error propagating path extraction process that extracts error propagating paths to an error-observation node through each fault candidate using the logic circuit configuration information, the signal line expected values, the fault candidates, and the error-observation nodes and stores the extracted error propagating paths as error propagating path information;

a base fault candidate extraction process that uses the logic circuit configuration information, the fault candidates, scores of the fault candidates, and the error propagating path information to extract an error propagating path, which has the highest fault possibility, from un-extracted error propagating paths in all test patterns and stores base information in a fault candidate classification storage unit as a base candidate group; and a second error propagating path classification process that classifies the paths, through which an error propagates from the base candidate group, into an error propagating path group by referencing the fault candidates and error propagating path information and by referring to the base information, stores fault candidates, included in a base path in the group, as a fault candidate group and, if there is an unselected base candidate group, repeats the grouping operation.

21. The program according to claim 16, causing said computer to output, relating multiple fault assumed estimation result, a list of candidate name, fault type and score in each of fault candidate groups.

* * * * *